US012677683B2

(12) United States Patent
Ha et al.

(10) Patent No.: US 12,677,683 B2
(45) Date of Patent: Jul. 7, 2026

(54) SEMICONDUCTOR PACKAGE

(71) Applicant: Samsung Electronics Co., Ltd.,
Suwon-si (KR)

(72) Inventors: Seungsoo Ha, Seongnam-si (KR);
Juyoun Choi, Hwaseong-si (KR);
Junho Lee, Suwon-si (KR)

(73) Assignee: SAMSUNG ELECTRONICS CO.,
LTD., Suwon-si (KR)

( * ) Notice: Subject to any disclaimer, the term of this
patent is extended or adjusted under 35
U.S.C. 154(b) by 657 days.

(21) Appl. No.: 17/871,902

(22) Filed: Jul. 23, 2022

(65) Prior Publication Data

US 2023/0060946 A1 Mar. 2, 2023

(30) Foreign Application Priority Data

Aug. 31, 2021 (KR) ........................ 10-2021-0115805

(51) Int. Cl.
*H10W 70/65* (2026.01)
*H10W 70/685* (2026.01)
*H10W 74/10* (2026.01)
*H10W 90/00* (2026.01)

(52) U.S. Cl.
CPC ......... *H10W 70/65* (2026.01); *H10W 70/685*
(2026.01); *H10W 74/117* (2026.01); *H10W*
*90/401* (2026.01); *H10W 90/701* (2026.01)

(58) Field of Classification Search
CPC ........... H01L 23/3128; H01L 23/49816; H01L
23/49822; H01L 23/49833; H01L 25/105;
H01L 23/49838
See application file for complete search history.

(56) References Cited

U.S. PATENT DOCUMENTS

| | | | |
|---|---|---|---|
| 9,972,601 B2 | 5/2018 | Meyer et al. |
| 10,748,856 B2 | 8/2020 | Moon et al. |
| 10,943,878 B2 | 3/2021 | Lee et al. |
| 2020/0144165 A1 | 5/2020 | Park et al. |
| 2020/0161204 A1 | 5/2020 | Kim et al. |
| 2020/0161237 A1 | 5/2020 | Cho et al. |
| 2020/0365544 A1 | 11/2020 | Chen et al. |

(Continued)

FOREIGN PATENT DOCUMENTS

KR 1020210077820 A 6/2021

*Primary Examiner* — Jeff W Natalini
*Assistant Examiner* — Rose Keagy
(74) *Attorney, Agent, or Firm* — Muir Patent Law, PLLC

(57) ABSTRACT

The upper redistribution structure of the semiconductor
package includes an upper redistribution insulating layer
disposed on a semiconductor chip; a first upper redistribu-
tion line pattern extending in a horizontal direction inside
the upper redistribution insulating layer; a first upper redis-
tribution via pattern extending in a vertical direction inside
the upper redistribution insulating layer and configured to
connect plurality of first conductive pads to the first upper
redistribution line pattern; a pad line pattern extending in the
horizontal direction in an upper portion of the upper redis-
tribution insulating layer and configured to connect plurality
of second conductive pads with each other; and a pad via
pattern extending in the vertical direction inside the upper
redistribution insulating layer and configured to connect at
least one of the plurality of first conductive pads to the
conductive connection member.

17 Claims, 17 Drawing Sheets

10

(56) References Cited

U.S. PATENT DOCUMENTS

| | | | | |
|---|---|---|---|---|
| 2020/0381404 A1* | 12/2020 | Mok | .................. | H01L 23/5386 |
| 2021/0183785 A1* | 6/2021 | Kwon | .............. | H01L 23/49838 |
| 2021/0313266 A1* | 10/2021 | Patil | ...................... | H01L 24/16 |
| 2023/0039914 A1* | 2/2023 | Choi | ...................... | H01L 23/66 |
| 2023/0054984 A1* | 2/2023 | Kim | ...................... | H01L 25/50 |
| 2023/0067767 A1* | 3/2023 | Kim | .................. | H01L 23/5283 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2021-0115805, filed on Aug. 31, 2021, in the Korean Intellectual Property Office, the disclosure of which is incorporated by reference herein in its entirety.

BACKGROUND

The inventive concept relates to a semiconductor package, and more particularly, to a package-on-package (PoP)-type semiconductor package.

At the same time as the storage capacity of semiconductor chips is increased, semiconductor packages including semiconductor chips are required to be thin and light. In addition, there is a trend for research conducted to include semiconductor chips of various functions in a semiconductor package and studies are being conducted to rapidly drive the semiconductor chips. In response to this trend, research into a PoP-type semiconductor package in which an upper semiconductor package is mounted on a lower semiconductor package has been conducted. For example, research for improving signal integrity of the PoP-type semiconductor package has been actively conducted.

SUMMARY

The inventive concept provides a semiconductor package having an improved signal integrity.

The inventive concept also provides a semiconductor package having an improved structural reliability.

According to an aspect of the inventive concept, there is provided a semiconductor package including a semiconductor chip having a first surface and a second surface opposite to the first surface; a lower redistribution structure disposed on the first surface of the semiconductor chip; conductive connection members disposed on the lower redistribution structure so as to be outside the semiconductor chip; an upper redistribution structure disposed on the second surface of the semiconductor chip; and a plurality of first conductive pads disposed on the upper redistribution structure to be spaced apart from each other; and a plurality of second conductive pads on the upper redistribution structure to be connected with each other, wherein the upper redistribution structure includes an upper redistribution insulating layer disposed on the second surface of the semiconductor chip; a first upper redistribution line pattern extending in a horizontal direction inside the upper redistribution insulating layer; a first upper redistribution via pattern extending in a vertical direction inside the upper redistribution insulating layer and configured to connect the plurality of first conductive pads to the first upper redistribution line pattern; a pad line pattern extending in the horizontal direction in an upper portion of the upper redistribution insulating layer and configured to connect the plurality of second conductive pads with each other; and a pad via pattern extending in the vertical direction inside the upper redistribution insulating layer and configured to connect at least one of the plurality of first conductive pads to at least one of the conductive connection members.

According to another aspect of the inventive concept, there is provided a semiconductor package including a semiconductor chip having a first surface and a second surface opposite to the first surface; a lower redistribution structure disposed on the first surface of the semiconductor chip; a substrate layer disposed on the lower redistribution structure and configured to surround the semiconductor chip, and including a plurality of base layers stacked in a vertical direction; a plurality of substrate line patterns disposed on at least one of upper and lower surfaces of the plurality of base layers; and a plurality of substrate via patterns configured to pass through the plurality of base layers in the vertical direction and connect the plurality of substrate line patterns; an upper redistribution structure disposed on the second surface of the semiconductor chip; a plurality of first conductive pads disposed on the upper redistribution structure to be spaced apart from each other; and a plurality of second conductive pads on the upper redistribution structure to be connected with each other, wherein the upper redistribution structure includes an upper redistribution insulating layer on the second surface of the semiconductor chip; a first upper redistribution line pattern extending in a horizontal direction inside the upper redistribution insulating layer and configured to connect the plurality of first conductive pads; and a pad line pattern extending in the horizontal direction in an upper portion of the upper redistribution insulating layer and configured to connect the plurality of second conductive pads.

According to another aspect of the inventive concept, there is provided a semiconductor package including a semiconductor chip having a first surface and a second surface opposite to the first surface; a lower redistribution structure disposed on the first surface of the semiconductor chip; a plurality of conductive posts disposed on the lower redistribution structure to surround the semiconductor chip; a molding layer configured to surround the semiconductor chip and the plurality of conductive posts on the lower redistribution structure; an upper redistribution structure disposed on the molding layer; a plurality of first conductive pads disposed on the upper redistribution structure to be spaced apart from each other; and a plurality of second conductive pads on the upper redistribution structure to be connected with each other, wherein the upper redistribution structure includes an upper redistribution insulating layer on the second surface of the semiconductor chip; a first upper redistribution line pattern extending in a horizontal direction inside the upper redistribution insulating layer and connected to the plurality of first conductive pads; and a pad line pattern extending in the horizontal direction in an upper portion of the upper redistribution insulating layer and connected to the plurality of second conductive pads.

The semiconductor package according to an embodiment may include an upper redistribution line pattern that connects the plurality of conductive pads inside the upper redistribution insulating layer. The upper redistribution line pattern may be disposed inside the upper redistribution insulating layer, and thus, the arrangement of the upper redistribution line pattern may be facilitated, and a relatively greater thickness of the upper redistribution line pattern may be secured. Accordingly, implementation of the impedance value required by signals moving through the plurality of conductive pads may be facilitated through the arrangement and thickness design of the upper redistribution line pattern. For example, the signal integrity of the semiconductor package may be improved.

Also, since the semiconductor package according to an embodiment includes the upper redistribution line pattern extending inside the upper redistribution insulating layer and having a relatively greater thickness, the structural reliability of the semiconductor package may be improved.

BRIEF DESCRIPTION OF THE DRAWINGS

Embodiments of the inventive concept will be more clearly understood from the following detailed description taken in conjunction with the accompanying drawings in which like numerals refer to like elements throughout. In the drawings:

FIG. 5 is a cross-sectional view of a semiconductor package, according to a comparative example;

FIG. 10 is a cross-sectional view of a semiconductor package, according to an example embodiment;

DETAILED DESCRIPTION OF THE EMBODIMENTS

Hereinafter, embodiments of the inventive concept will be described in detail with reference to the accompanying drawings.

Figure 1:
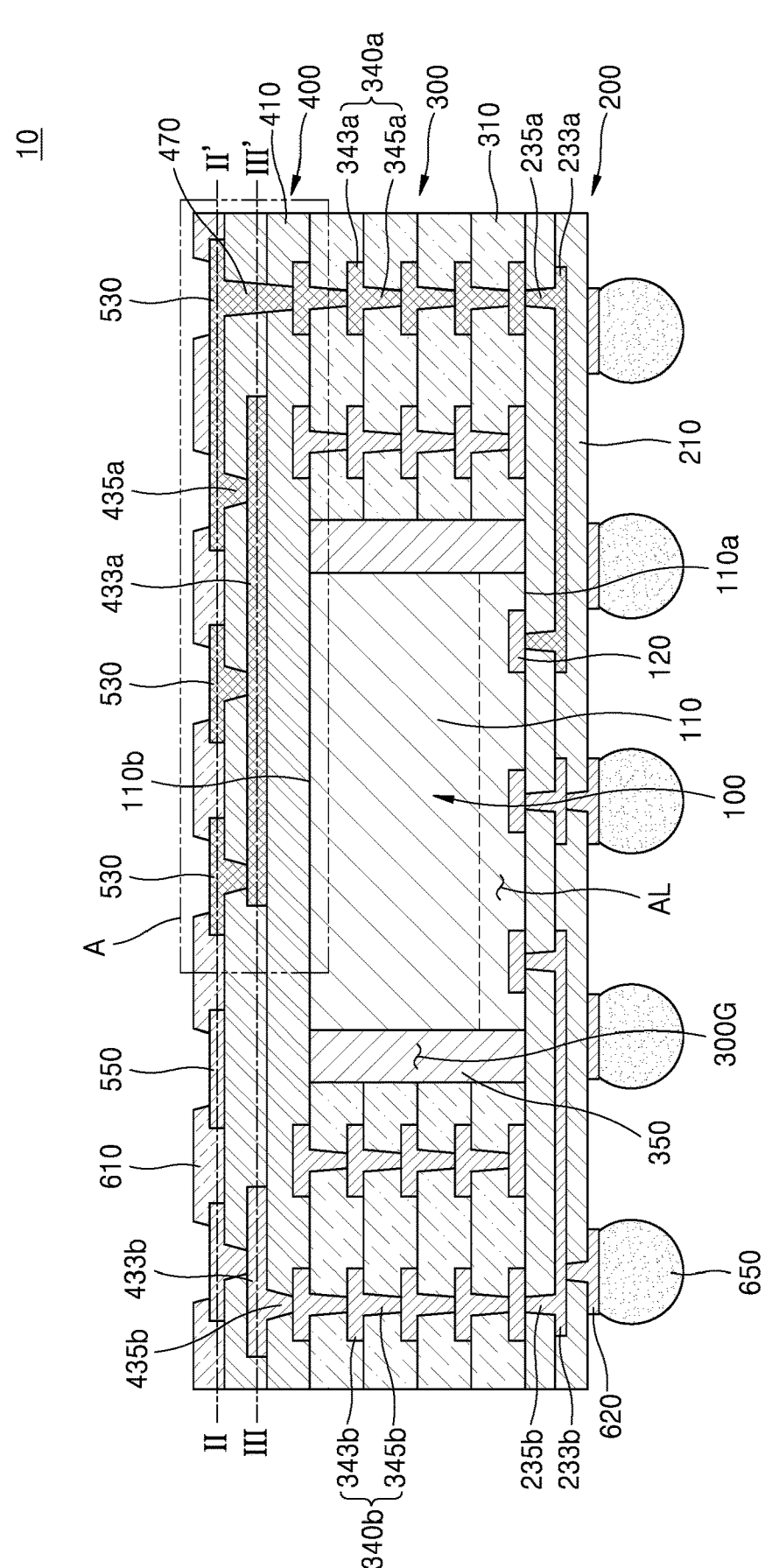
FIG. 1 is a cross-sectional view of a semiconductor package, according to an example embodiment.
Figure 2:
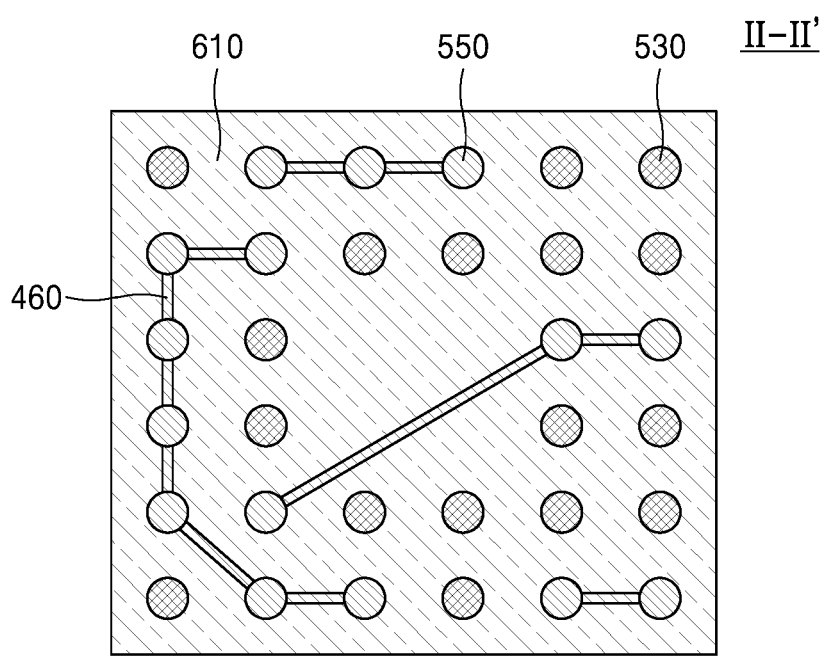
FIG. 2 is a cut cross-sectional view of a region indicated by II-II' in FIG. 1.

FIG. 1 is a cross-sectional view of a semiconductor package 10 according to an example embodiment. FIG. 2 is a cut cross-sectional view of a region indicated by II-II' in FIG. 1, and FIG. 3 is a cut cross-sectional view of a region indicated by III-III' in FIG. 1.

The semiconductor package 10 according to an example embodiment may be a lower semiconductor package constituting a package on package (PoP)-type semiconductor package.

Figure 3:
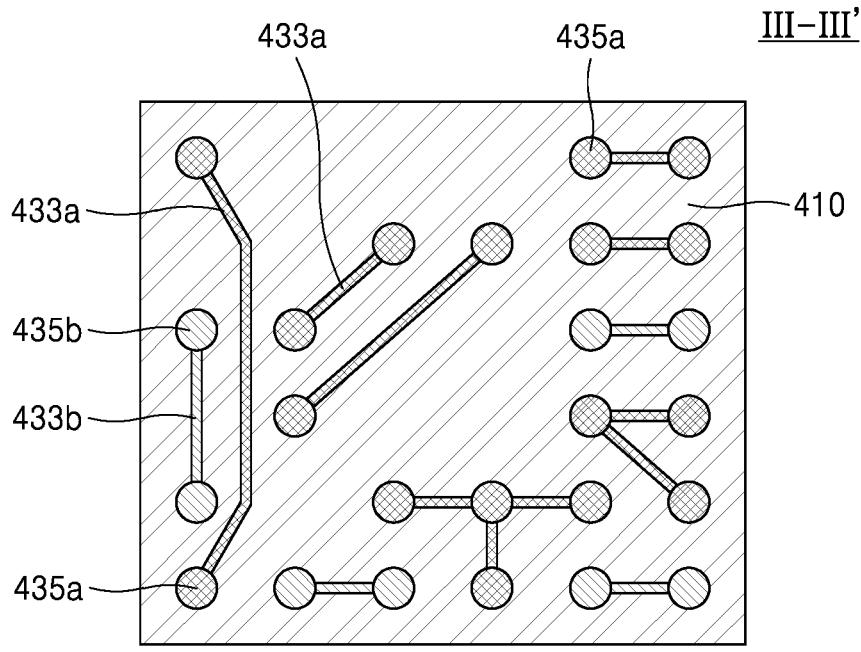
FIG. 3 is a cut cross-sectional view of a region indicated by III-III' in FIG. 1.

Referring to FIGS. 1 to 3, the semiconductor package 10 according to an example embodiment may include a semiconductor chip 100, a lower redistribution structure 200, a substrate layer 300, a cover insulating layer 350, an upper redistribution structure 400, a plurality of first and second conductive pads 530 and 550, a passivation layer 610, an external connection pad 620, and an external connection terminal 650.

The semiconductor chip 100 may be mounted on the lower redistribution structure 200. Also, the semiconductor chip 100 may include a semiconductor substrate 110 having an active layer AL, and a chip pad 120.

In an example embodiment, the semiconductor chip 100 may include a logic semiconductor chip. For example, the semiconductor chip 100 may include a logic semiconductor chip such as a central processor unit (CPU), a microprocessor unit (MPU), a graphics processor unit (GPU), or an application processor (AP).

However, the inventive concept is not limited thereto, and the semiconductor chip 100 may include a memory semiconductor chip. For example, the semiconductor chip 100 may include a volatile memory semiconductor chip such as dynamic random access memory (DRAM) or static random access memory (SRAM), and may include a non-volatile memory semiconductor chip such as phase-change random access memory (PRAM), magneto resistive random access memory (MRAM), ferroelectric random access memory (FeRAM), or resistive random access memory (RRAM).

Also, the semiconductor package 10 is illustrated as including one semiconductor chip 100 in FIG. 1, but the inventive concept is not limited thereto, and the semiconductor package 10 may include two or more semiconductor chips. For example, the semiconductor package 10 may include a plurality of semiconductor chips, and the semiconductor package 10 may be a system in package (SIP) in which a plurality of different types of semiconductor chips are electrically connected to each other and operate as a system.

The semiconductor chip 100 may have a first surface 110a adjacent to the active layer AL and a second surface 110b opposite to the first surface 110a. The first surface 110a may be a lower surface of the semiconductor substrate 110 facing the lower redistribution structure 200, and the second surface 110b may be an upper surface of the semiconductor substrate 110 facing the upper redistribution structure 400.

Hereinafter, a horizontal direction may be defined as a direction parallel to a direction in which the first surface 110a and the second surface 110b of the semiconductor chip 100 extend, and a vertical direction may be defined as a direction perpendicular to a direction in which the first surface 110a and the second surface 110b of the semiconductor chip 100 extend.

In an example embodiment, the semiconductor substrate 110 may include silicon (Si). In addition, the semiconductor substrate 110 may include a semiconductor element such as germanium (Ge), or may include a compound semiconductor such as silicon carbide (SiC), gallium arsenide (GaAs), indium arsenide (InAs), and indium phosphide (InP). However, the material of the semiconductor substrate 110 is not limited to those described above.

In an example embodiment, the semiconductor substrate 110 may have the active layer AL in a part adjacent to the first surface 110a. The active layer AL may include a plurality of various types of individual devices. For example, the plurality of individual devices may include various micro electronic devices, for example, a complementary metal-oxide semiconductor (CMOS) transistor, a metal-oxide-semiconductor field effect transistor (MOS-FET), system large scale integration (LSI), an image sensor such as a CMOS imaging sensor (CIS), a micro-electro-mechanical system (MEMS), an active device, and a passive device.

The chip pad 120 of the semiconductor chip 100 may be a pad disposed on the first surface 110a of the semiconductor substrate 110 and electrically connected to the plurality of individual devices in the active layer AL. As shown in FIG. 1, a plurality of chip pads 120 of the semiconductor chip 100 may be provided.

The lower redistribution structure 200 may be disposed on the first surface 110a of the semiconductor chip 100. In addition, the lower redistribution structure 200 may include a lower redistribution insulating layer 210, a first lower redistribution line pattern 233a, a second lower redistribution line pattern 233b, a first lower redistribution via pattern 235a, and a second lower redistribution via pattern 235b. In example embodiments, the lower redistribution insulating layer 210 may be a plurality of lower redistribution insulating layers 210, the first lower redistribution line pattern 233a may be a plurality of first lower redistribution line patterns 233a, the second lower redistribution line pattern 233b may be a plurality of second lower redistribution line patterns 233b, the first lower redistribution via pattern 235a may be a plurality of first lower redistribution via patterns 235a, and the second lower redistribution via pattern 235b may be a plurality of second lower redistribution via patterns 235b.

The lower redistribution insulating layer 210 is disposed on the first surface 110a of the semiconductor chip 100 and may include an insulating material. In an example embodiment, the material of the lower redistribution insulating layer 210 may include oxide or nitride. For example, the lower redistribution insulating layer 210 may include silicon oxide or silicon nitride.

The first lower redistribution line pattern 233a and the second lower redistribution line pattern 233b may extend in the horizontal direction inside the lower redistribution insulating layer 210. In an example embodiment, the first lower redistribution line pattern 233a may be electrically connected to the chip pad 120, the first lower redistribution via pattern 235a, the first conductive connection member 340a, the pad via pattern 470, the first conductive pad 530, the first upper redistribution via pattern 435a, and the first upper redistribution line pattern 433a. For example, the first lower redistribution line pattern 233a may provide a movement path of a data signal toward the semiconductor chip 100.

In addition, the second lower redistribution line pattern 233b may be electrically connected to the chip pad 120, the second lower redistribution via pattern 235b, the second conductive connection member 340b, the second upper redistribution via pattern 435b, the second upper redistribution line pattern 433b, the pad line pattern 460, and the second conductive pad 550.

For example, the second lower redistribution line pattern 233b may provide a movement path of a power signal for the operation of the semiconductor chip 100 or a movement path of a ground signal for grounding the semiconductor chip 100. However, the inventive concept is not limited thereto, and the second lower redistribution line pattern 233b may provide a movement path of a command signal and/or an address signal of the semiconductor chip 100.

The first lower redistribution via pattern 235a and the second lower redistribution via pattern 235b may extend in the vertical direction inside the lower redistribution insulating layer 210. In an example embodiment, the first lower redistribution via pattern 235a may connect the chip pad 120 to the first lower redistribution line pattern 233a, may connect the first conductive connection member 340a to the first lower redistribution line pattern 233a, or may connect the external connection pad 620 to the first lower redistribution line pattern 233a.

Also, the second lower redistribution via pattern 235b may connect the chip pad 120 to the second lower redistribution line pattern 233b, may connect the second conductive connection member 340b to the second lower redistribution line pattern 233b, or may connect the external connection pad 620 to the second lower redistribution line pattern 233b.

In an example embodiment, materials of the first lower redistribution line pattern 233a, the second lower redistribution line pattern 233b, the first lower redistribution via pattern 235a, and the second lower redistribution via pattern 235b may include copper (Cu). However, the inventive concept is not limited thereto, and the materials of the first lower redistribution line pattern 233a, the second lower redistribution line pattern 233b, the first lower redistribution via pattern 235a, and the second lower redistribution via pattern 235b may be a metal such as nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru) or an alloy thereof.

The substrate layer 300 may be disposed on the lower redistribution structure 200 to have a mounting space 300G accommodating the semiconductor chip 100. For example, the substrate layer 300 may surround a side portion of the semiconductor chip 100 disposed in the mounting space 300G.

As the semiconductor package 10 includes the substrate layer 300, the semiconductor package 10 may be a fan-out panel level package (FOPLP). For example, a length of the mounting space 300G of the substrate layer 300 in the horizontal direction may be greater than a length of the semiconductor chip 100 in the horizontal direction. Also, inner surfaces of the substrate layer 300 may be spaced apart from side surfaces of the semiconductor chip 100.

The substrate layer 300 may be a printed circuit board (PCB), a ceramic substrate, a wafer for manufacturing a package, or an interposer. For example, the substrate layer 300 may be a multi-layer printed circuit board.

The substrate layer 300 may include a plurality of base layers 310 and a first conductive connection member 340a and a second conductive connection member 340b passing through the plurality of base layers 310 in the vertical direction.

The plurality of base layers 310 may be stacked in the vertical direction. For example, the plurality of base layers 310 may constitute a multi-layer substrate. In an example embodiment, the plurality of base layers 310 may be formed of at least one material selected from a phenol resin, an epoxy resin, and a polyimide. The base layers 310 may include at least one material selected from, for example, frame retardant 4 (FR-4), tetrafunctional epoxy, polyphenylene ether, epoxy/polyphenylene oxide, bismaleimide triazine (BT), thermount, cyanate ester, polyimide, and liquid crystal polymer.

The first conductive connection member 340a may pass through the plurality of base layers 310 in the vertical direction and electrically connect the first lower redistribution via pattern 235a of the lower redistribution structure 200 to the pad via pattern 470 of the upper redistribution structure 400. In addition, the second conductive connection member 340b may pass through the plurality of base layers 310 in the vertical direction and connect the second lower redistribution via pattern 235b of the lower redistribution structure 200 to the second upper redistribution via pattern 435b of the upper redistribution structure 400.

In an example embodiment, the first conductive connection member 340a may include a plurality of first substrate line patterns 343a disposed on at least one of upper and lower surfaces of the plurality of base layers 310, and a plurality of first substrate via patterns 345a passing through the plurality of base layers 310 in the vertical direction and connecting the plurality of first substrate line patterns 343a with each other. In addition, the second conductive connection member 340b may include a plurality of second substrate line patterns 343b disposed on at least one of the upper and lower surfaces of the plurality of base layers 310, and a plurality of second substrate via patterns 345a passing through the plurality of base layers 310 in the vertical direction and connecting the plurality of second substrate line patterns 343b with each other.

The cover insulating layer 350 may fill a space between the semiconductor chip 100 and the substrate layer 300 and may include an insulating material. For example, the cover insulating layer 350 may be provided in the mounting space 300G between the semiconductor chip 100 and the substrate layer 300, contacting side surfaces of the semiconductor chip 100 and the substrate layer 300 and an upper surface of the lower redistribution insulating layer 210. As used herein, the term "contact" refers to direct contact (i.e., touching) unless the context indicates otherwise.

In an example embodiment, the cover insulating layer 350 may include a thermosetting resin such as an epoxy resin, a thermoplastic resin such as polyimide, etc. For example, the cover insulating layer 350 may include an epoxy molding compound (EMC). However, the material of the cover insulating layer 350 is not limited to that described above.

The upper redistribution structure 400 may be disposed on the second surface 110b of the semiconductor chip 100. In addition, the upper redistribution structure 400 may include an upper redistribution insulating layer 410, a first upper redistribution line pattern 433a, a second upper redistribution line pattern 433b, a first upper redistribution via pattern 435a, a second upper redistribution via pattern 435b, a pad line pattern 460, and a pad via pattern 470. In example embodiments, the upper redistribution insulating layer 410 may be a plurality of upper redistribution insulating layers 410, the first upper redistribution line pattern 433a may be a plurality of first upper redistribution line patterns 433a, the second upper redistribution line pattern 433b may be a plurality of second upper redistribution line patterns 433b, the first upper redistribution via pattern 435a may be a plurality of first upper redistribution via patterns 435a, the second upper redistribution via pattern 435b may be a plurality of second upper redistribution via patterns 435b, the pad line pattern 460 may be a plurality of pad line patterns 460, and the pad via pattern 470 may be a plurality of pad via patterns 470.

The upper redistribution insulating layer 410 may be disposed on the second surface 110b of the semiconductor chip 100 and may include an insulating material. For example, the upper redistribution insulating layer 410 may contact the second surface 110b of the semiconductor chip 100. In an example embodiment, the material of the upper redistribution insulating layer 410 may include oxide or nitride.

The first upper redistribution line pattern 433a and the second upper redistribution line pattern 433b may extend in the horizontal direction inside the upper redistribution insulating layer 410.

In an example embodiment, the first upper redistribution line pattern 433a may be a pattern for electrically connecting the plurality of first conductive pads 530 with each other inside the upper redistribution insulating layer 410. For example, the first upper redistribution line pattern 433a may electrically connect the plurality of first conductive pads 530 with each other through the first upper redistribution via patterns 435a.

The first upper redistribution line pattern 433a may be electrically connected to the chip pad 120, the first lower redistribution via pattern 235a, the first lower redistribution line pattern 233a, the first conductive connection member 340a, the pad via pattern 470, the first conductive pad 530, and the first upper redistribution via pattern 435a. For example, the first upper redistribution line pattern 433a may provide a movement path of a data signal toward the semiconductor chip 100.

The second upper redistribution line pattern 433b may be a pattern connected to at least one of the plurality of second conductive pads 550 inside the upper redistribution insulating layer 410. For example, the second upper redistribution line pattern 433b may be electrically connected to at least one of the plurality of second conductive pads 550 through the second upper redistribution via patterns 435b.

The second upper redistribution line pattern 433b may be electrically connected to the chip pad 120, the second lower redistribution via pattern 235b, the second lower redistribution line pattern 233b, the second conductive connection member 340b, the second upper redistribution via pattern 435b, the pad line pattern 460, and the second conductive pad 550. For example, the second upper redistribution line pattern 433b may provide a movement path of a power signal for an operation of the semiconductor chip 100 or a movement path of a ground signal for grounding the semiconductor chip 100. However, the inventive concept is not limited thereto, and the second upper redistribution line pattern 433b may provide a movement path of a command signal and/or an address signal of the semiconductor chip 100.

The first upper redistribution via pattern 435a and the second upper redistribution via pattern 435b may extend in the vertical direction inside the upper redistribution insulating layer 410. In an example embodiment, the first upper redistribution via pattern 435a may connect the first conductive pad 530 and the first upper redistribution line pattern 433a to each other.

In addition, the second upper redistribution via pattern 435b may connect the second conductive pad 550 to the second upper redistribution line pattern 433b or may connect the second conductive connection member 340b to the second upper redistribution line patterns 433b.

The pad line pattern 460 may extend in the horizontal direction in an upper portion of the upper redistribution insulating layer 410 to be configured to electrically connect the plurality of second conductive pads 550 with each other.

Referring to FIG. 2, the plurality of second conductive pads 550 may be electrically connected with each other through the pad line pattern 460. Accordingly, the plurality of second conductive pads 550 may be electrically connected with each other on the upper portion of the upper redistribution insulating layer 410.

Also, the plurality of first conductive pads 530 may be spaced apart from each other. For example, the plurality of second conductive pads 550 may not be connected with each other on the upper portion of the upper redistribution insulating layer 410.

Referring to FIG. 3, the plurality of first upper redistribution via patterns 435a may be electrically connected with each other through the first upper redistribution line pattern 433a extending inside the upper redistribution insulating layer 410. Accordingly, the plurality of first conductive pads 530 may be electrically connected with each other through the first upper redistribution line pattern 433a extending from the inside of the upper redistribution insulating layer 410.

The plurality of second conductive pads 550 may be electrically connected to each other through the pad line pattern 460 on the upper portion of the upper redistribution insulating layer 410, so that the number of second upper redistribution line patterns 433b electrically connecting the plurality of second conductive pads 550 inside the upper redistribution insulating layer 410 may be reduced. Accordingly, the number and density of the first upper redistribution line patterns 433a electrically connecting the plurality of first conductive pads 530 inside the upper redistribution insulating layer 410 may increase.

For example, when the plurality of first conductive pads 530 are connected to each other through the first upper redistribution line pattern 433*a* inside the upper redistribution insulating layer 410, the arrangement of the first upper redistribution line pattern 433*a* may be free, and greater width and thickness of the first upper redistribution line pattern 433*a* than those of a pad line pattern may be secured, compared to the case where the plurality of first conductive pads 530 are connected to each other through the pad line pattern extending from the upper portion of the upper redistribution insulating layer 410.

Accordingly, implementation of an impedance value required by signals moving through the plurality of first conductive pads 530 may be eased through the first upper redistribution line pattern 433*a*. Also, impedance values between signals moving through the plurality of first conductive pads 530 may be uniformly maintained.

The pad via pattern 470 may pass through a part of the upper redistribution insulating layer 410 in the vertical direction to electrically connect at least one of the plurality of first conductive pads 530 and the first conductive connection member 340*a*. Specifically, the pad via pattern 470 may pass through a part of the upper redistribution insulating layer 410 in the vertical direction and electrically connect the first conductive pad 530 to the first substrate line pattern 343*a* disposed on an upper surfaces of the base layer 310. In some embodiments, the pad via pattern 470 may pass through portions of a plurality of upper redistribution insulating layers 410.

The plurality of first conductive pads 530 may be spaced apart from each other on the upper portion of the upper redistribution insulating layer 410. Also, the plurality of first conductive pads 530 may be electrically connected with each other through the first upper redistribution line pattern 433*a* extending from the inside of the upper redistribution insulating layer 410. Also, the plurality of first conductive pads 530 may be pads for connecting a separate semiconductor package mounted on the semiconductor package 10 to the semiconductor package 10 of the inventive concept.

In an example embodiment, the plurality of first conductive pads 530 may be pads provided for movement of data signals between the plurality of semiconductor chips. Also, at least one of the plurality of first conductive pads 530 may be electrically connected to the first conductive connection member 340*a* through the pad via pattern 470. For example, a length of the first conductive pad 530 in contact with the pad via pattern 470 among the plurality of first conductive pads 530 in the horizontal direction may be greater than a length of the first conductive pad 530 that is not in contact with the pad via pattern 470 among the plurality of first conductive pads 530 in the horizontal direction.

The plurality of second conductive pads 550 may be connected with each other on the upper portion of the upper redistribution insulating layer 410. Specifically, the plurality of second conductive pads 550 may be electrically connected to each other through the pad line pattern 460 extending from the upper portion of the upper redistribution insulating layer 410. Also, the plurality of second conductive pads 560 may be pads for connecting a separate semiconductor package mounted on the semiconductor package 10 to the semiconductor package 10 of the inventive concept.

In an example embodiment, the plurality of second conductive pads 550 may be pads provided for movement of a power signal of the semiconductor chip 100 or provided for movement of a ground signal for grounding the semiconductor chip 100. However, the inventive concept is not limited thereto, and the plurality of second conductive pads 550 may be pads provided for movement of a command signal and/or an address signal of the semiconductor chip 100.

The passivation layer 610 may be disposed on an upper portion of the upper redistribution structure 400 to expose at least a part of the plurality of first conductive pads 530 and at least a part of the plurality of second conductive pads 550.

In an example embodiment, the material of the passivation layer 610 may include silicon nitride (SiN). However, the material of the passivation layer 610 is not limited thereto, and may include one of silicon oxynitride (SiON), silicon oxide (SiO$_2$), silicon carbonitride (SiOCN), silicon carbonitride (SiCN), and a combination thereof. However, the material of the passivation layer 610 is not limited to those described above.

The external connection pad 620 may be a pad disposed on a lower surface of the lower redistribution structure 200 and to which the external connection terminal 650 is attached. For example, the external connection terminal 650 may be disposed on and may contact the external connection pad 620. In addition, the external connection pad 620 may be electrically connected to the first lower redistribution line pattern 233*a*, the second lower redistribution line pattern 233*b*, the first lower redistribution via pattern 235*a*, and the second lower redistribution via pattern 235*b*.

The external connection terminal 650 may be a terminal attached on one surface of the external connection pad 620 and connecting the semiconductor package 10 to an external device. In example embodiments, the external connection pad 620 and the external connection terminal 650 may be a plurality of external connection pads 620 and a plurality of external connection terminals 650, respectively, and each of the external connection terminals 650 may be disposed on and in contact with a corresponding one of the external connection pads 620. In embodiments, at least one of the plurality of external connection terminals 650 may not vertically overlap the semiconductor chip 100. In an example embodiment, the external connection terminal 650 may be a solder ball of a metal material including at least one of tin (Sn), silver (Ag), copper (Cu), and aluminum (Al).

The semiconductor package 10 according to the example embodiment may include the first upper redistribution line pattern 433*a* connecting the plurality of first conductive pads 530 inside the upper redistribution insulating layer 410. The first upper redistribution line pattern 433*a* of the inventive concept may not be disposed on the surface of the upper redistribution insulating layer 410, but may be disposed inside the upper redistribution insulating layer 410, and thus, the arrangement of the first upper redistribution line pattern 433*a* may be facilitated, and a great thickness of the first upper redistribution line pattern 433*a* may be secured.

Accordingly, implementation of impedance values required by signals moving through the plurality of first conductive pads 530 may be facilitated through the arrangement and thickness design of the first upper redistribution line pattern 433*a*. Also, impedance values between signals moving through the plurality of first conductive pads 530 may be uniformly maintained.

For example, the semiconductor package 10 according to the example embodiment may include the first upper redistribution line pattern 433*a* connecting the plurality of first conductive pads 530 inside the upper redistribution insulating layer 410, and thus, the signal integrity of the semiconductor package 10 may be improved.

Also, the thickness of the first upper redistribution line pattern 433a of the semiconductor package 10 according to the example embodiment may be relatively increased, and thus, the structural reliability of the semiconductor package 10 may be improved.

Figure 4:
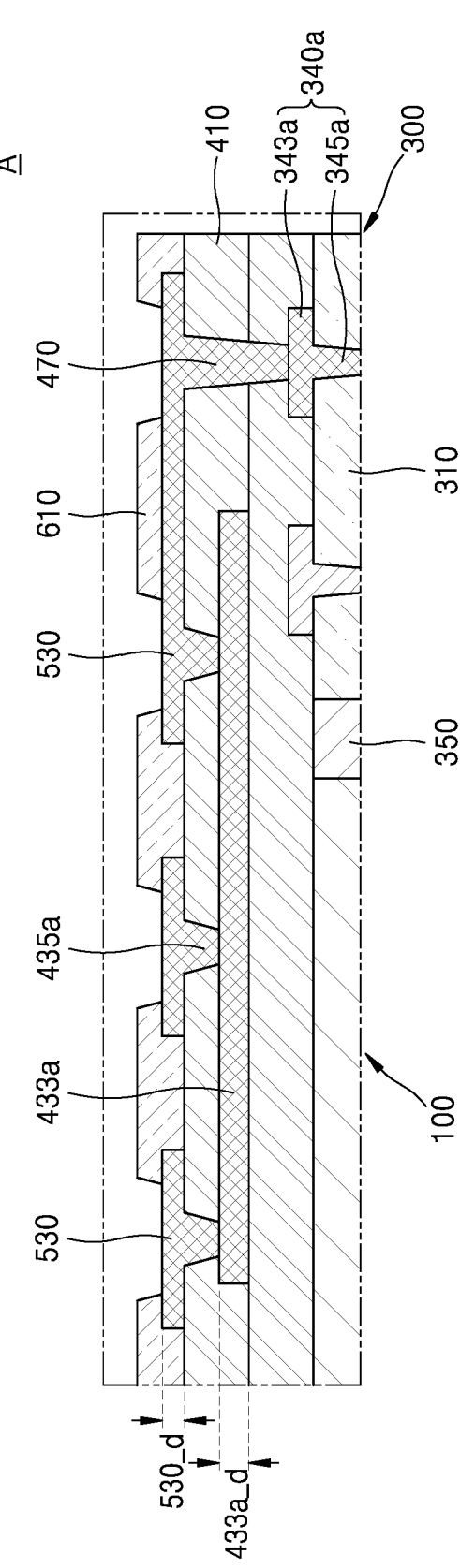
FIG. 4 is an enlarged view of a region A in FIG. 1.

FIG. 4 is an enlarged view of a region A in FIG. 1.

Referring to FIG. 4, a length of the pad via pattern 470 extending in the vertical direction inside the upper redistribution insulating layer 410 and connecting the first conductive pad 530 to the first conductive connection member 340a in the vertical direction may be greater than a length of the first upper redistribution via pattern 435a extending in the vertical direction inside the upper redistribution insulating layer 410 and connecting the first conductive pad 530 to the first upper redistribution line pattern 433a in the vertical direction. For example, the pad via pattern 470 may extend from a top surface of a first one of the upper redistribution insulating layers 410 to a vertical level lower than a top surface of a second one of the upper redistribution insulating layers 410, and the first upper redistribution via pattern 435a may extend from the top surface of the first one of the upper redistribution insulating layers 410 to a vertical level higher than a bottom surface of the first one of the upper redistribution insulating layers 410.

In an example embodiment, the pad via pattern 470 may be disposed outside the first upper redistribution line pattern 433a. For example, the pad via pattern 470 may be formed on an edge portion of the upper redistribution insulating layer 410, and the first upper redistribution line pattern 433a may be formed on a central portion of the upper redistribution insulating layer 410.

Hereinafter, a thickness 530_d of the first conductive pad 530 may be defined as a length of the first conductive pad 530 in the vertical direction. In an example embodiment, the thickness 530_d of the first conductive pad 530 may be about 5 micrometers to about 15 micrometers.

Also, a thickness 433a_d of the first upper redistribution line pattern 433a may be defined as a length of the first upper redistribution line pattern 433a in the vertical direction, and a thickness 433a_d of the first upper redistribution line pattern 433a may be greater than the thickness 530_d of the first conductive pad 530. In an example embodiment, the thickness 433a_d of the first upper redistribution line pattern 433a may be greater than the thickness 530_d of the first conductive pad 530 within a range of about 7 micrometers to about 40 micrometers. For example, the thickness 433a_d of the first upper redistribution line pattern 433a may be about 20 micrometers.

Also, the thickness 433a_d of the first upper redistribution line pattern 433a may be greater than the thickness of the second upper redistribution line pattern 433b illustrated in FIG. 2. Accordingly, the first upper redistribution line pattern 443a may provide a relatively low impedance value, and the signal integrity of a data signal moving through the first upper redistribution line pattern 443a may be improved.

Figure 5:
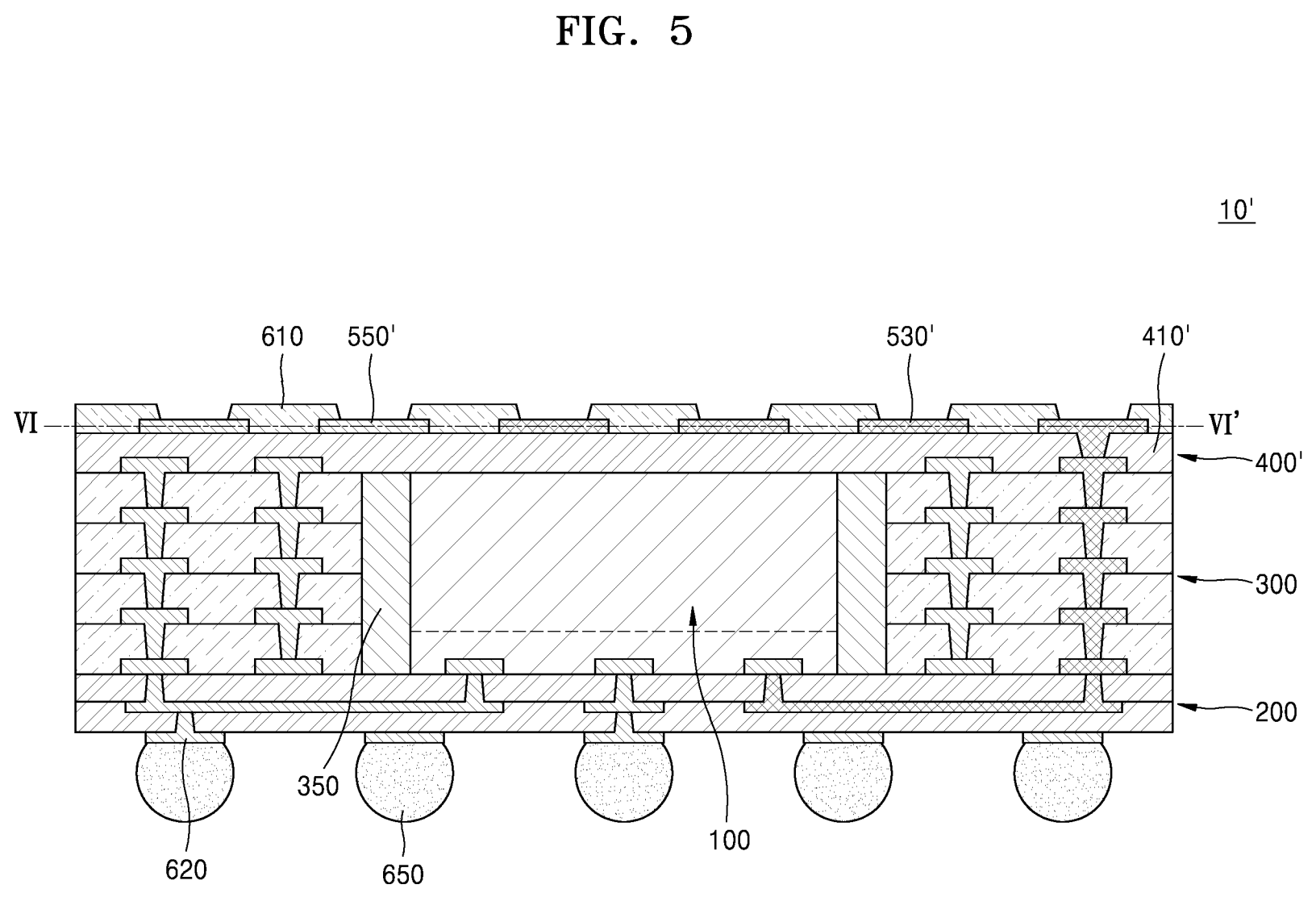

FIG. 5 is a cross-sectional view of a semiconductor package 10' according to a comparative example. Also, FIG. 6 is a cut cross-sectional view of a region indicated by VI-VI' in FIG. 5.

Figure 6:
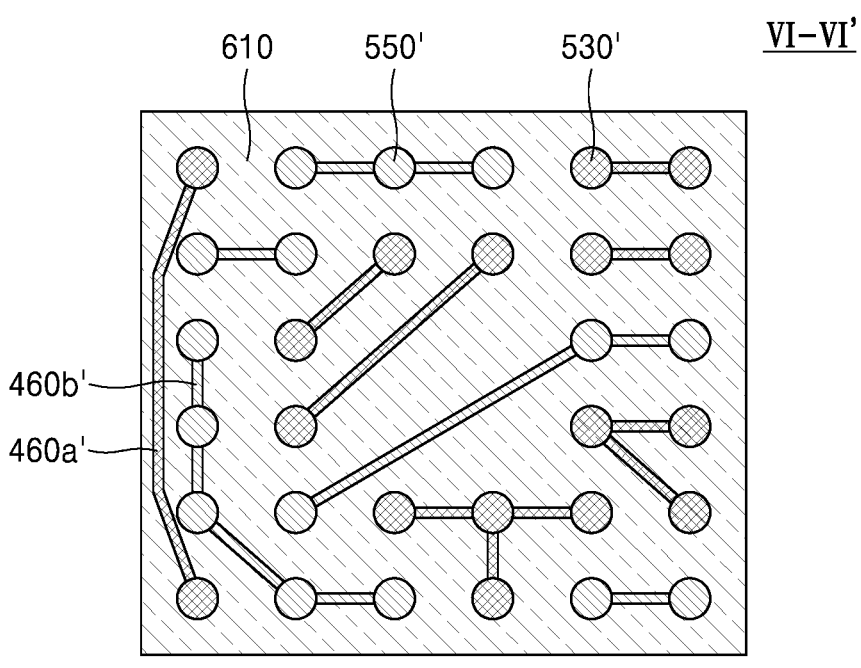
FIG. 6 is a cut cross-sectional view of a region indicated by VI-VI' in FIG. 5.

Referring to FIGS. 5 and 6 together, the semiconductor package 10' according to the comparative example may include the semiconductor chip 100, the lower redistribution structure 200, the substrate layer 300, the cover insulating layer 350, an upper redistribution structure 400, a plurality of first and second conductive pads 530' and 550', first and second pad line patterns 460a' and 460b', a passivation layer 610, an external connection pad 620, and an external connection terminal 650.

Referring to FIGS. 5 and 6 together, the plurality of first conductive pads 530' may be electrically connected with each other through the first pad line pattern 460a' extending in the horizontal direction in an upper portion of the upper redistribution structure 400. Also, the plurality of second conductive pads 550' may be electrically connected with each other through the second pad line pattern 460b' extending in the horizontal direction in the upper portion of the upper redistribution structure 400.

The first and second pad line patterns 460a' and 460b' of the semiconductor package 10' according to the comparative example may be disposed on the upper portion of the upper redistribution structure 400, and thus, there may be restrictions on the arrangement and size design of the first pad line pattern 460a' connecting the plurality of first conductive pads 530'. For example, because the area of an upper surface of the upper redistribution structure 400 is limited and the second pad line pattern 460b' is disposed on the upper surface of the upper redistribution structure 400, there may be restrictions on the arrangement, width, and pitch design of the first pad line pattern 460a' on the upper redistribution structure 400.

Accordingly, the first pad line pattern 460a' connecting the plurality of first conductive pads 530' may be difficult to provide a relatively low impedance value. That is, the signal integrity of data signals moving through the plurality of first conductive pads 530' and the first pad line pattern 460a' may be vulnerable.

The semiconductor package 10 according to the example embodiment described with reference to FIGS. 1 to 4 may include the first upper redistribution line pattern 433a electrically connecting the plurality of first conductive pads 530 inside the upper redistribution insulating layer 410.

The first upper redistribution line pattern 433a may be disposed inside the upper redistribution insulating layer 410, and thus, the arrangement and size design of the first upper redistribution line pattern 433a may be facilitated. Also, the first upper redistribution line pattern 433a may be disposed inside the upper redistribution insulating layer 410, and thus, a great thickness of the first upper redistribution line pattern 433a may be secured.

Accordingly, implementation of impedance values required by signals moving through the plurality of first conductive pads 530 may be facilitated through the arrangement and thickness design of the first upper redistribution line pattern 433a. Also, the impedance values between the signals moving through the plurality of first conductive pads 530 may be uniformly maintained. For example, the signal integrity of the semiconductor package 10 may be improved.

Figure 7:
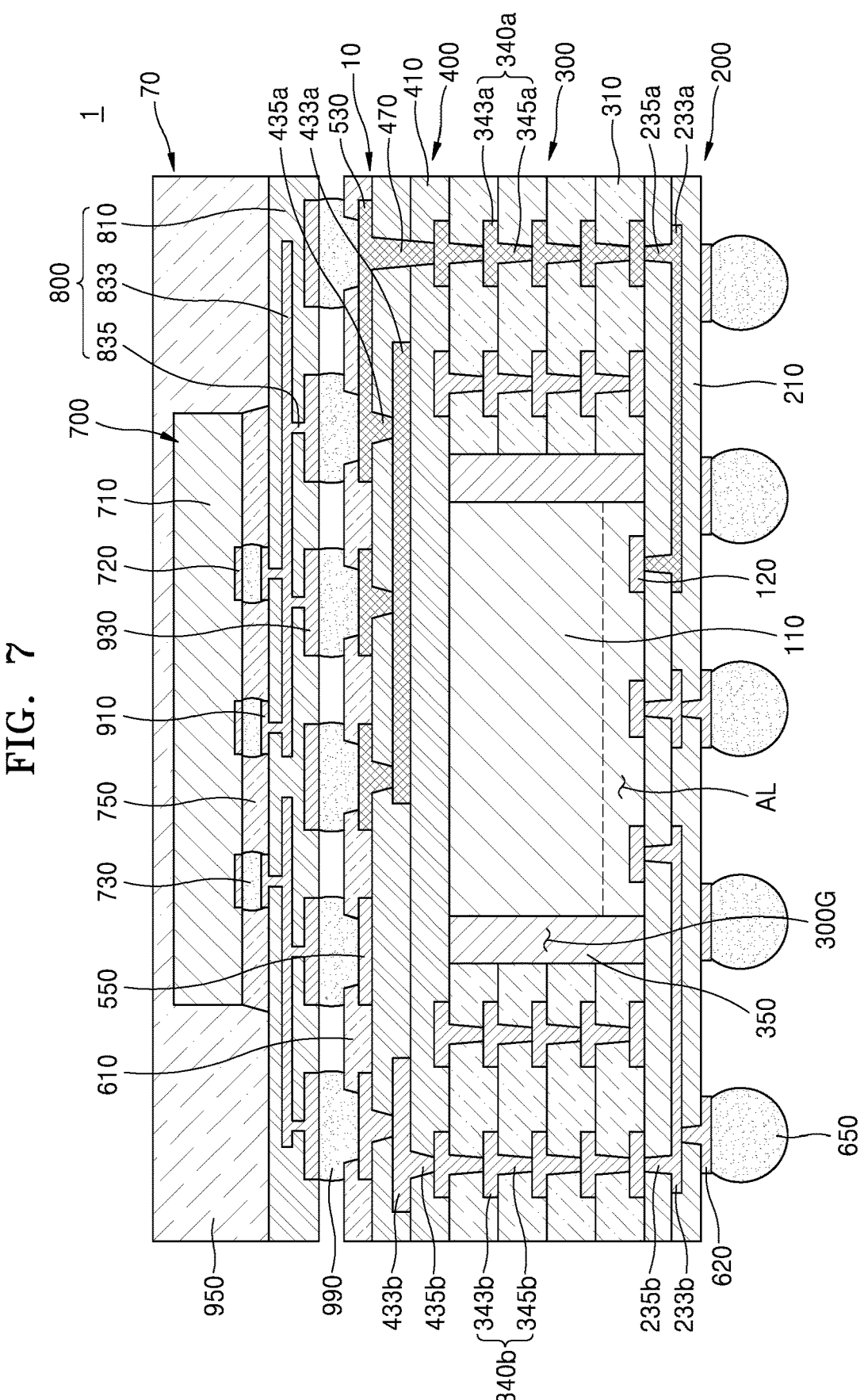
FIG. 7 is a cross-sectional view of a semiconductor package, according to an example embodiment.

FIG. 7 is a cross-sectional view of a semiconductor package 1 according to an example embodiment. In an example embodiment, the semiconductor package 1 may be a PoP-type semiconductor package including the lower semiconductor package 10 and an upper semiconductor package 70. The lower semiconductor package 10 may be the semiconductor package described with reference to FIGS. 1 to 4.

The upper semiconductor package 70 may include a semiconductor chip 700, a chip connection terminal 730, an underfill layer 750, a redistribution structure 800, a chip connection pad 910, a package connection pad 930, a package connection terminal 990, and a molding layer 950. In example embodiments, the chip connection terminal 730 may be a plurality of chip connection terminals 730, the chip connection pad 910 may be a plurality of chip connection pads 910, the package connection pad 930 may be a plurality of package connection pads 930, and the package connection terminal 990 may be a plurality of package connection terminals 990.

The semiconductor chip 700 may include a memory semiconductor chip. The memory semiconductor chip may include, for example, a volatile memory semiconductor chip such as dynamic random access memory (DRAM) or static random access memory (SRAM), and may include a non-volatile memory semiconductor chip such as phase-change random access memory (PRAM), magneto resistive random access memory (MRAM), ferroelectric random access memory (FeRAM), or resistive random access memory (RRAM).

The semiconductor chip 700 may include a semiconductor substrate 710 having an active layer, and a chip pad 720 connected to each of a plurality of individual devices in the active layer. In embodiments, the chip pad 720 may be a plurality of chip pads 720. The chip connection terminal 730 may be between the chip pad 720 of the semiconductor chip 700 and the chip connection pad 910 disposed on the redistribution structure 800, and may connect the semiconductor chip 700 to the redistribution structure 800.

The underfill layer 750 may be disposed between the semiconductor chip 700 and the redistribution structure 800 and may surround a side portion of the chip connection terminal 730. The underfill layer 750 may be configured to fix the semiconductor chip 700 on the redistribution structure 800.

In an example embodiment, the underfill layer 750 may include at least one of an insulating polymer and an epoxy resin. For example, the underfill layer 750 may include an EMC.

However, the inventive concept is not limited to those described above, and an adhesive layer may be disposed between the semiconductor chip 700 and the redistribution structure 800. The adhesive layer may surround the side portion of the chip connection terminal 730 between the semiconductor chip 700 and the redistribution structure 800.

The redistribution structure 800 may include a redistribution insulating layer 810, a redistribution line pattern 833 extending in the horizontal direction inside the redistribution insulating layer 810, and a redistribution via pattern 835 extending in the vertical direction inside the redistribution insulating layer 810.

In an example embodiment, the redistribution via pattern 835 may connect the chip connection pad 910 to the redistribution line pattern 833 or may connect the package connection pad 930 to the redistribution line pattern 833.

The molding layer 950 may be mounted on the redistribution structure 800 and may surround the semiconductor chip 700. In an example embodiment, the molding layer 950 may include at least one of an insulating polymer and an epoxy resin. For example, the molding layer 950 may include an EMC.

The package connection terminal 990 may be disposed between the package connection pad 930 and the first conductive pad 530 and between the package connection pad 930 and the second conductive pad 550. In an example embodiment, the package connection terminal 990 may be a solder ball of a metal material including at least one of tin (Sn), silver (Ag), copper (Cu), and aluminum (Al).

In an example embodiment, a data signal of the semiconductor chip 700 of the upper semiconductor package 70 may move to the semiconductor chip 100 of the lower semiconductor package 10 through the chip pad 720, the chip connection terminal 730, the chip connection pad 910, the redistribution line pattern 833, the redistribution via pattern 835, the package connection pad 930, the package connection terminal 990, the first conductive pad 530, the first upper redistribution via pattern 435a, the first upper redistribution line pattern 433a, the pad via pattern 470, the first conductive connection member 340a, the first lower redistribution via pattern 235a, the first lower redistribution line pattern 233a, and the chip pad 120.

In an example embodiment, the first upper redistribution line pattern 433a of the lower semiconductor package 10 may be disposed inside the upper redistribution insulating layer 410, and thus, a relatively greater thickness of the first upper redistribution line pattern 433a connecting the plurality of the first conductive pads 530 for transmission of the data signal may be secured.

Accordingly, implementation of an impedance value required by the data signals may be facilitated through the first upper redistribution line pattern 433a. For example, the thickness of the first upper redistribution line pattern 433a may be relatively great, and thus, a relatively small impedance may be implemented. For example, the signal integrity of the semiconductor package 1 may be improved.

Figure 8:
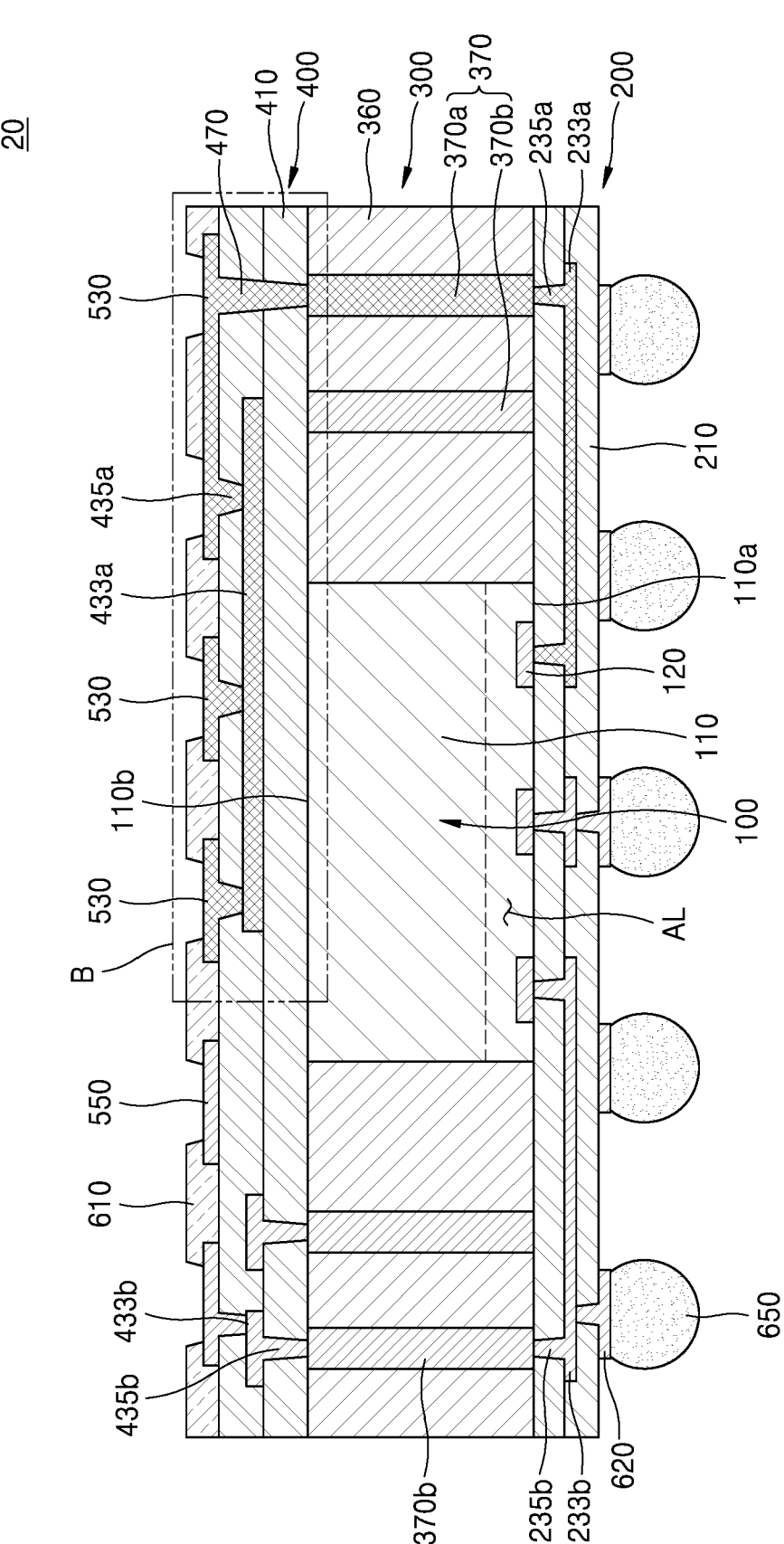
FIG. 8 is a cross-sectional view of a semiconductor package, according to an example embodiment.

FIG. 8 is a cross-sectional view of a semiconductor package 20 according to an example embodiment. Also, FIG. 9 is an enlarged view of a region B in FIG. 8.

Figure 9:
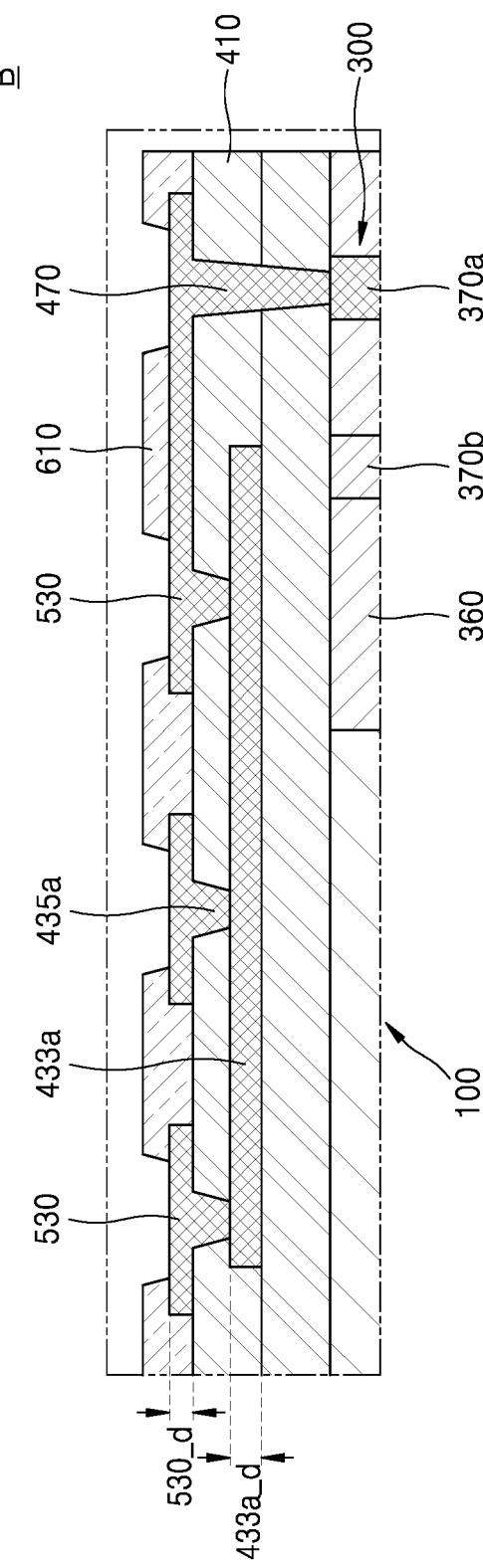
FIG. 9 is an enlarged view of a region B in FIG. 8.

Referring to FIGS. 8 and 9 together, the semiconductor package 20 according to an example embodiment may include the semiconductor chip 100, the lower redistribution structure 200, the molding layer 360, the conductive connection member 370, the upper redistribution structure 400, the plurality of first and second conductive pads 530 and 550, the passivation layer 610, the external connection pad 620, and the external connection terminal 650. In example embodiments, the conductive connection member 370 may be a plurality of conductive connection members 370, the external connection pad 620 may be a plurality of external connection pads 620, and the external connection terminal 650 may be a plurality of external connection terminals 650.

The semiconductor package 20 according to an example embodiment may be a wafer level package. Specifically, the semiconductor package 20 may be a fan-out wafer level package in which at least one of the plurality of external connection terminals 650 is disposed outside the semiconductor chip 100. For example, at least one of the plurality of external connection terminals 650 may not vertically overlap the semiconductor chip 100.

Hereinafter, redundant descriptions between the semiconductor package 10 of FIGS. 1 to 4 and the semiconductor package 20 of FIGS. 8 and 9 are omitted, and differences therebetween are mainly described.

The molding layer 360 may surround the semiconductor chip 100 on an upper portion of the lower redistribution structure 200. In an example embodiment, the molding layer 360 may include at least one of an insulating polymer and an epoxy resin. For example, the molding layer 360 may include an EMC.

In an example embodiment, a lower surface of the molding layer 360 may be on the same plane as an upper surface of the lower redistribution structure 200. For example, the lower surface of the molding layer 360 may contact the upper surface of the lower redistribution structure 200. The lower surface of the molding layer 360 may be coplanar with the first surface 110a of the semiconductor chip 100. Also, an upper surface of the molding layer 360 may be on the same plane as the second surface 110b of the semiconductor chip 100 and a lower surface of the upper redistribution structure 400. For example, the upper surface of the molding layer 360 may be coplanar with the second surface 110*b* of the semiconductor chip 100.

In an example embodiment, the conductive connection member 370 may be configured to connect the lower redistribution structure 200 to the upper redistribution structure 400. In an example embodiment, the conductive connection member 370 may include a first conductive post 370*a* and a second conductive post 370*b*.

The first conductive post 370*a* may pass through the molding layer 360 in the vertical direction and electrically connect the first lower redistribution via pattern 235*a* of the lower redistribution structure 200 to the pad via pattern 470 of the upper redistribution structure 400. In addition, the second conductive post 370*b* may pass through the molding layer 360 in the vertical direction and electrically connect the second lower redistribution via pattern 235*b* of the lower redistribution structure 200 to the second upper redistribution via pattern 435*b* of the upper redistribution structure 400. Upper surfaces of the first and second conductive posts 370*a* and 370*b* and the molding layer 360 may be coplanar with one another, and lower surfaces of the first and second conductive posts 370*a* and 370*b* and the molding layer 360 may be coplanar with one another.

In an example embodiment, the first conductive post 370*a* may be a plurality of first conductive posts 370*a* and the second conductive post 370*b* may be a plurality of second conductive posts 370*b*. The first and second conductive posts 370*a* and 370*b* may be posts disposed outside the semiconductor chip 100 and may include a conductive material. For example, the first and second conductive posts 370*a* and 370*b* may be disposed on the lower redistribution structure 200 to surround a side portion of the semiconductor chip 100.

In an example embodiment, the first conductive post 370*a* may be electrically connected to the first lower redistribution via pattern 235*a* and the first lower redistribution line pattern 233*a* of the lower redistribution structure 200, the pad via pattern 470 of the upper redistribution structure 400, the first conductive pad 530, the first upper redistribution via pattern 435*a*, and the first upper redistribution line pattern 433*a*. Also, the first conductive post 370*a* may provide a movement path of a data signal.

In an example embodiment, the second conductive post 370*b* may be electrically connected to the second lower redistribution via pattern 235*b* and the second lower redistribution line pattern 233*b* of the lower redistribution structure 200, the second conductive pad 550 of the upper redistribution structure 400, and the second upper redistribution line pattern 433*b*. Also, the second conductive post 370*b* may provide a movement path of a power signal of the semiconductor chip 100 or may provide a movement path of a ground signal for grounding the semiconductor chip 100. However, the inventive concept is not limited thereto, and the second conductive post 370*b* may provide a movement path of a command signal and/or an address signal of the semiconductor chip 100.

The semiconductor package 20 according to the example embodiment may include the first upper redistribution line pattern 433*a* connecting the plurality of first conductive pads 530 inside the upper redistribution insulating layer 410. The first upper redistribution line pattern 433*a* of the inventive concept may be disposed inside the upper redistribution insulating layer 410, and thus, the arrangement of the first upper redistribution line pattern 433*a* may be facilitated, and a greater thickness of the first upper redistribution line pattern 433*a* may be secured.

Accordingly, implementation of impedance values required by signals moving through the plurality of first conductive pads 530 may be facilitated through the arrangement and thickness design of the first upper redistribution line pattern 433*a*. For example, as the first upper redistribution line pattern 443*a* has a relatively greater thickness, the first upper redistribution line pattern 443*a* may provide a relatively low impedance value, and signal integrity of the data signal moving through the first upper redistribution line pattern 443*a* may be improved.

Also, the thickness of the first upper redistribution line pattern 433*a* of the semiconductor package 20 according to the example embodiment may be relatively increased, and thus, the structural reliability of the semiconductor package 10 may be improved.

Referring to FIG. 9, a length of the pad via pattern 470 extending in the vertical direction inside the upper redistribution insulating layer 410 and connecting the first conductive pad 530 to the first conductive post 370*a* may be greater than a length of the first upper redistribution via pattern 435*a* extending in the vertical direction inside the upper redistribution insulating layer 410 and connecting the first conductive pad 530 to the first upper redistribution line pattern 433*a*.

In an example embodiment, the thickness 530_*d* of the first conductive pad 530 may be about 5 micrometers to about 15 micrometers. Also, a thickness 433*a*_*d* of the first upper redistribution line pattern 433*a* may be greater than the thickness 530_*d* of the first conductive pad 530.

In an example embodiment, the thickness 433*a*_*d* of the first upper redistribution line pattern 433*a* may be greater than the thickness 530_*d* of the first conductive pad 530 within a range of about 7 micrometers to about 40 micrometers. For example, the thickness 433*a*_*d* of the first upper redistribution line pattern 433*a* may be about 20 micrometers.

Figure 10:
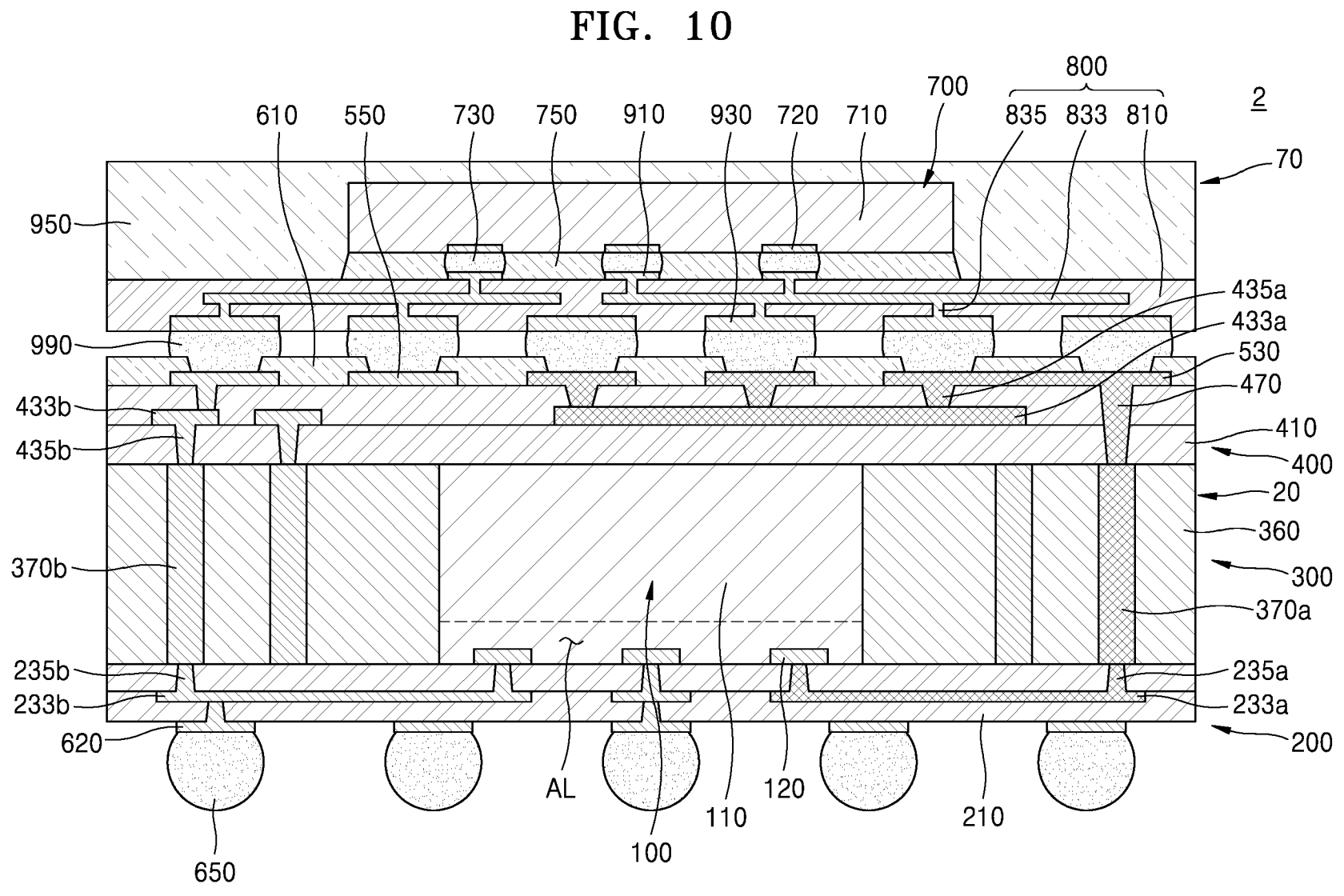

FIG. 10 is a cross-sectional view of a semiconductor package 2 according to an example embodiment.

The semiconductor package 2 may be a PoP-type semiconductor package including the lower semiconductor package 20 and the upper semiconductor package 70. The lower semiconductor package 20 may be the semiconductor package described with reference to FIGS. 8 and 9.

The upper semiconductor package 70 may include the semiconductor chip 700, the chip connection terminal 730, the underfill layer 750, the redistribution structure 800, the chip connection pad 910, the package connection pad 930, the package connection terminal 990, and the molding layer 950.

The technical idea related to the upper semiconductor package 70 is redundant with the description given with reference to FIG. 7, and thus, the detailed description thereof is omitted.

In an example embodiment, a data signal of the semiconductor chip 700 of the upper semiconductor package 70 may proceed to the semiconductor chip 100 of the lower semiconductor package 20 through the chip pad 720, the chip connection terminal 730, the chip connection pad 910, the redistribution line pattern 833, the redistribution via pattern 835, the package connection pad 930, the package connection terminal 990, the first conductive pad 530, the first upper redistribution via pattern 435*a*, the first upper redistribution line pattern 433*a*, the pad via pattern 470, the first conductive post 370*a*, the first lower redistribution via pattern 235*a*, the first lower redistribution line pattern 233*a*, and the chip pad 120.

In an example embodiment, the first upper redistribution line pattern 433a of the lower semiconductor package 20 may be disposed inside the upper redistribution insulating layer 410, and thus, a relatively greater thickness of the first upper redistribution line pattern 433a connecting the first conductive pads 530 for transmission of the data signal may be secured.

Accordingly, implementation of an impedance value required by the data signals may be facilitated through the first upper redistribution line pattern 433a. For example, because the thickness of the first upper redistribution line pattern 433a may be relatively large, a relatively small impedance may be implemented. For example, the signal integrity of the semiconductor package 2 may be improved.

Hereinafter, a method of manufacturing semiconductor packages according to example embodiments will be described with reference to the drawings.

Figure 11A:
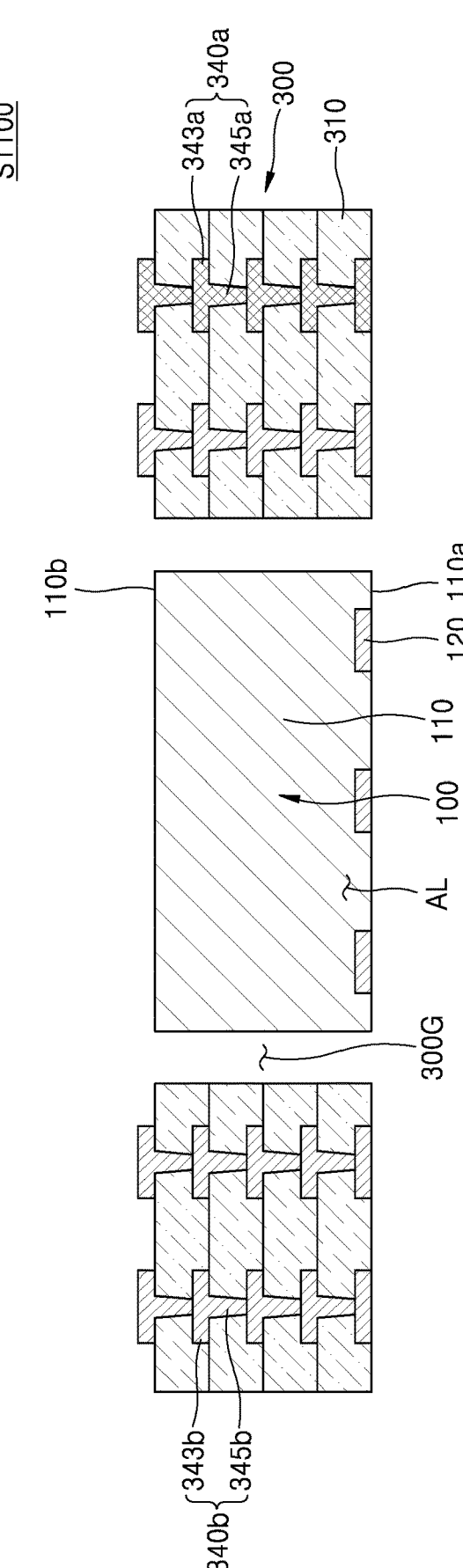
FIGS. 11A to 11D are diagrams illustrating respective operations of a method of manufacturing a semiconductor package, according to an example embodiment.
Figure 11B:
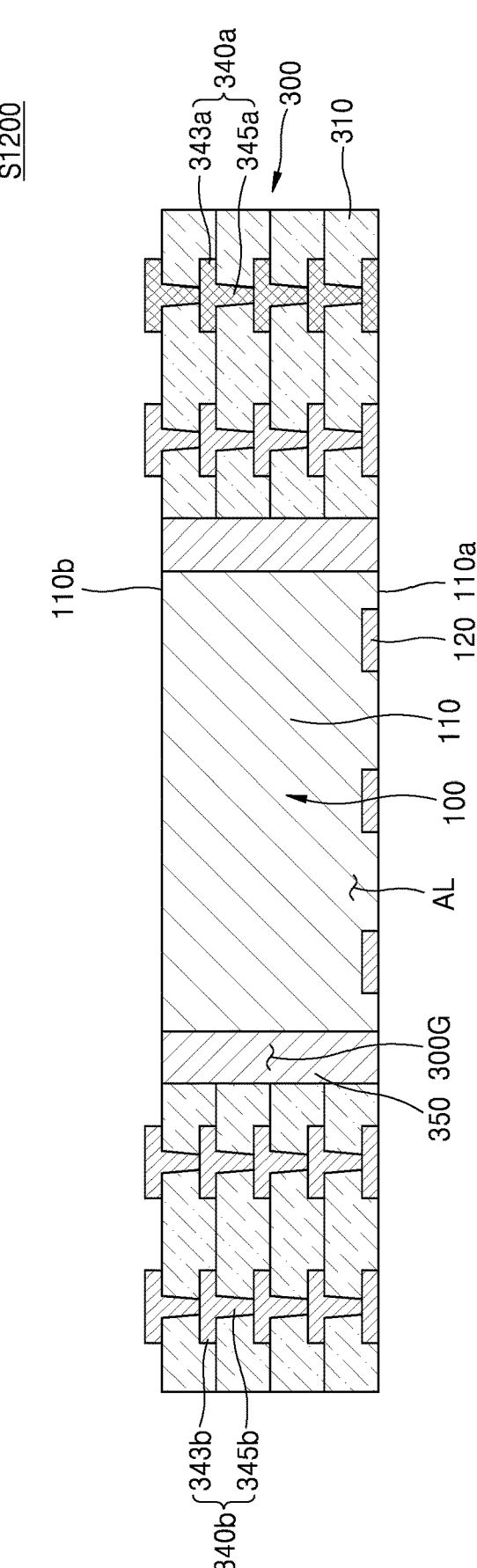
Figure 11C:
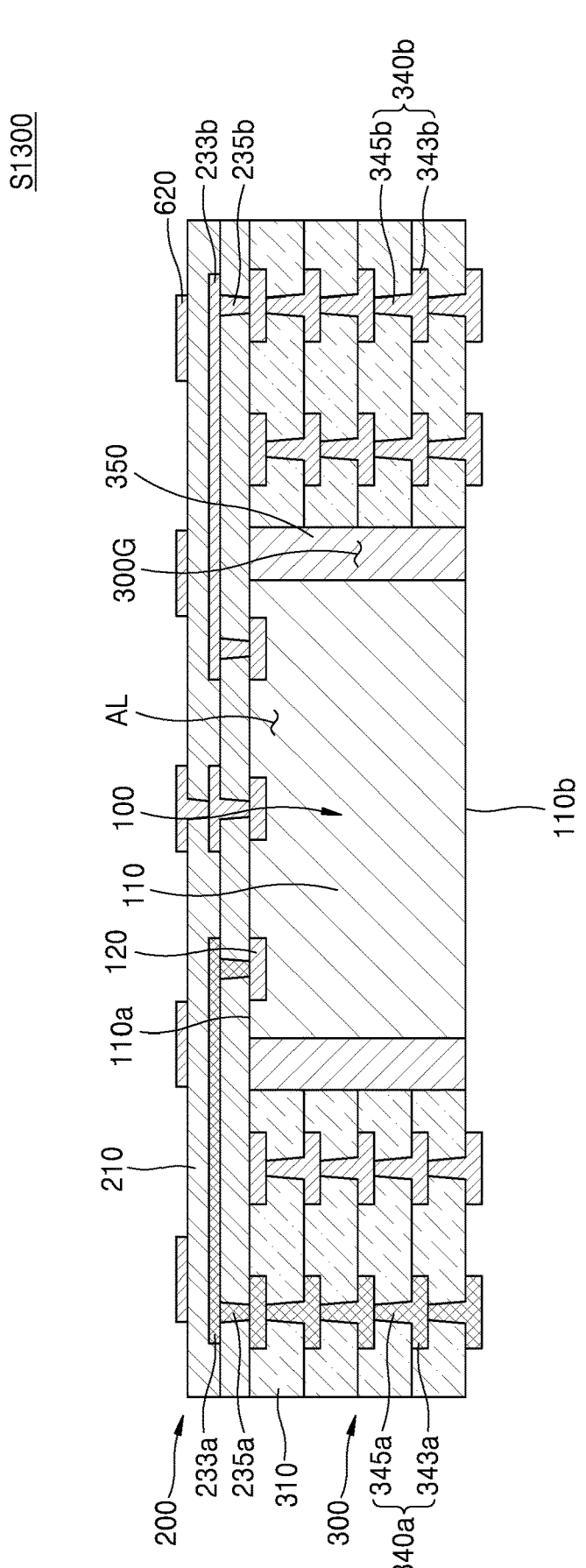
Figure 11D:
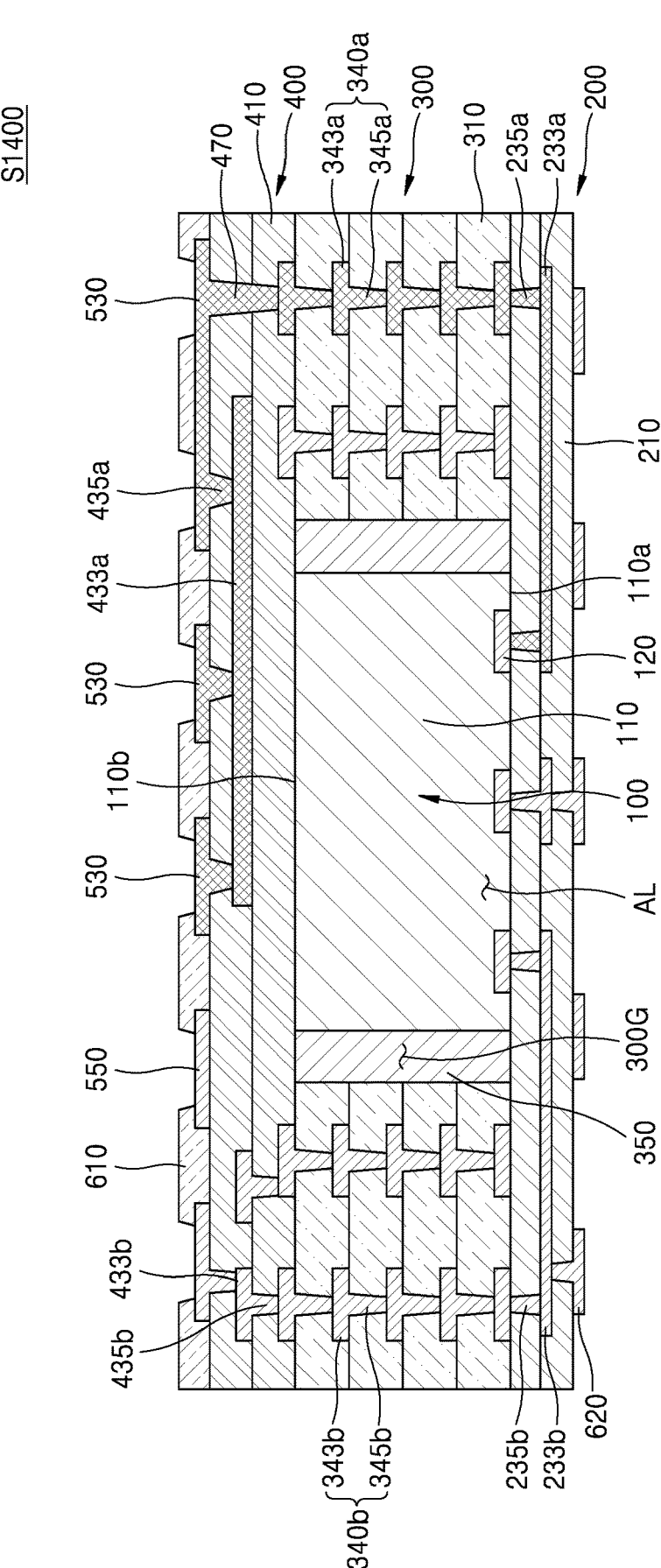

FIGS. 11A to 11D are diagrams illustrating respective operations S1100 to S1400 of a method of manufacturing a semiconductor package according to an example embodiment. Specifically, FIG. 11A illustrates operation S1100 of arranging the semiconductor chip 100 in the mounting space 300G of the substrate layer 300, FIG. 11B illustrates operation S1200 of forming the cover insulating layer 350 between the semiconductor chip 100 and the substrate layer 300, FIG. 11C illustrates operation S1300 of forming the lower redistribution structure 200, and FIG. 11D illustrates operation S1400 of forming the upper redistribution structure 400.

The method of manufacturing a semiconductor package according to the example embodiment may be the method of manufacturing an FOPLP described with reference to FIGS. 1 to 4.

The method of manufacturing a semiconductor package according to the example embodiment may include operation S1100 of arranging the semiconductor chip 100 in the mounting space 300G of the substrate layer 300, operation S1200 of forming the cover insulating layer 350 between the semiconductor chip 100 and the substrate layer 300, operation S1300 of forming the lower redistribution structure 200, and operation S1400 of forming the upper redistribution structure 400.

Referring to FIG. 11A, in operation S1100, the semiconductor chip 100 may be arranged in the mounting space 300G of the substrate layer 300. In an example embodiment, the semiconductor chip 100 may be arranged in the mounting space 300G of the substrate layer 300 such that a side surface of the semiconductor chip 100 is spaced apart from an inner surface of the substrate layer 300 in the horizontal direction.

In an example embodiment, the substrate layer 300 may be a ceramic substrate, a wafer for manufacturing a package, or an interposer. For example, the substrate layer 300 may be a multi-layer printed circuit board. In addition, the substrate layer 300 may include a plurality of base layers 310 and the first conductive connection member 340a and the second conductive connection member 340b passing through the plurality of base layers 310 in the vertical direction.

Referring to FIG. 11B, in operation S1200, the cover insulating layer 350 may be arranged in a space between the semiconductor chip 100 and the substrate layer 300. In an example embodiment, as the cover insulating layer 350 is arranged in the space between the semiconductor chip 100 and the substrate layer 300, the semiconductor chip 100 may be integrated with the substrate layer 300.

Referring to FIG. 11C, in operation S1300, the lower redistribution structure 200 may be formed. Specifically, operation S1300 may include forming the lower redistribution insulating layer 210 on the first surface 110a of the semiconductor chip 100, forming the first and second lower redistribution line patterns 233a and 233b inside the lower redistribution insulating layer 210, and forming first and second lower redistribution via patterns 235a and 235b inside the lower redistribution insulating layer 210.

In an example embodiment, the first and second lower redistribution line patterns 233a and 233b, and the first and second lower redistribution via patterns 235a and 235b may be formed through a general photolithography process, a plating process, an etching process, etc.

After operation S1300 is performed, an operation of forming the external connection pad 620 on the lower redistribution structure 200 may be additionally performed. The external connection pad 620 may be electrically connected to the chip pad 120 of the semiconductor chip 100 through the first and second lower redistribution line patterns 233a and 233b, and the first and second lower redistribution via patterns 235a and 235b.

Referring to FIG. 11D, in operation S1400, the upper redistribution structure 400 may be formed. Specifically, operation S1400 may include forming the upper redistribution insulating layer 410 on the second surface 110b of the semiconductor chip 100, and forming the first and second upper redistribution line patterns 433a and 433b, the first and second upper redistribution via patterns 435a and 435b, and the pad via pattern 470 inside the upper redistribution insulating layer 410.

In an example embodiment, the first and second upper redistribution line patterns 433a and 433b, the first and second upper redistribution via patterns 435a and 435b, and the via pattern 470 are formed through the general photolithography process, a plating process, an etching process, etc.

After operation S1400 is performed, an operation of forming the first and second conductive pads 530 and 550 on the upper redistribution structure 400 may be performed. Also, an operation of forming the passivation layer 610 exposing at least a part of the first and second conductive pads 530 and 550 on the upper redistribution structure 400 may be additionally performed.

In an example embodiment, the plurality of first conductive pads 530 may be pads provided for movement of a data signal. In addition, the plurality of first conductive pads 530 may be connected to the chip pad 120 of the semiconductor chip 100 through the first upper redistribution line pattern 433a, the first upper redistribution via pattern 435a, the pad via pattern 470, the first conductive connection member 340a, the first lower redistribution line pattern 233a, and the first lower redistribution via pattern 235a.

In an example embodiment, the first upper redistribution line pattern 433a may be disposed inside the upper redistribution insulating layer 410, and thus, a relatively greater thickness of the first upper redistribution line pattern 433a may be secured.

Accordingly, implementation of impedance values required by data signals moving through the plurality of first conductive pads 530 may be facilitated through the arrangement and thickness design of the first upper redistribution line pattern 433a. In addition, the plurality of first conductive pads 530 may be electrically connected through the first upper redistribution line pattern 433a, and thus the impedance values of the data signals moving through the plurality of first conductive pads 530 may be maintained uniformly.

In addition, the relatively greater thickness of the first upper redistribution line pattern 433a may be secured, and thus structural reliability of the semiconductor package manufactured by the method of manufacturing the semiconductor package of the inventive concept may be improved.

Figure 12A:
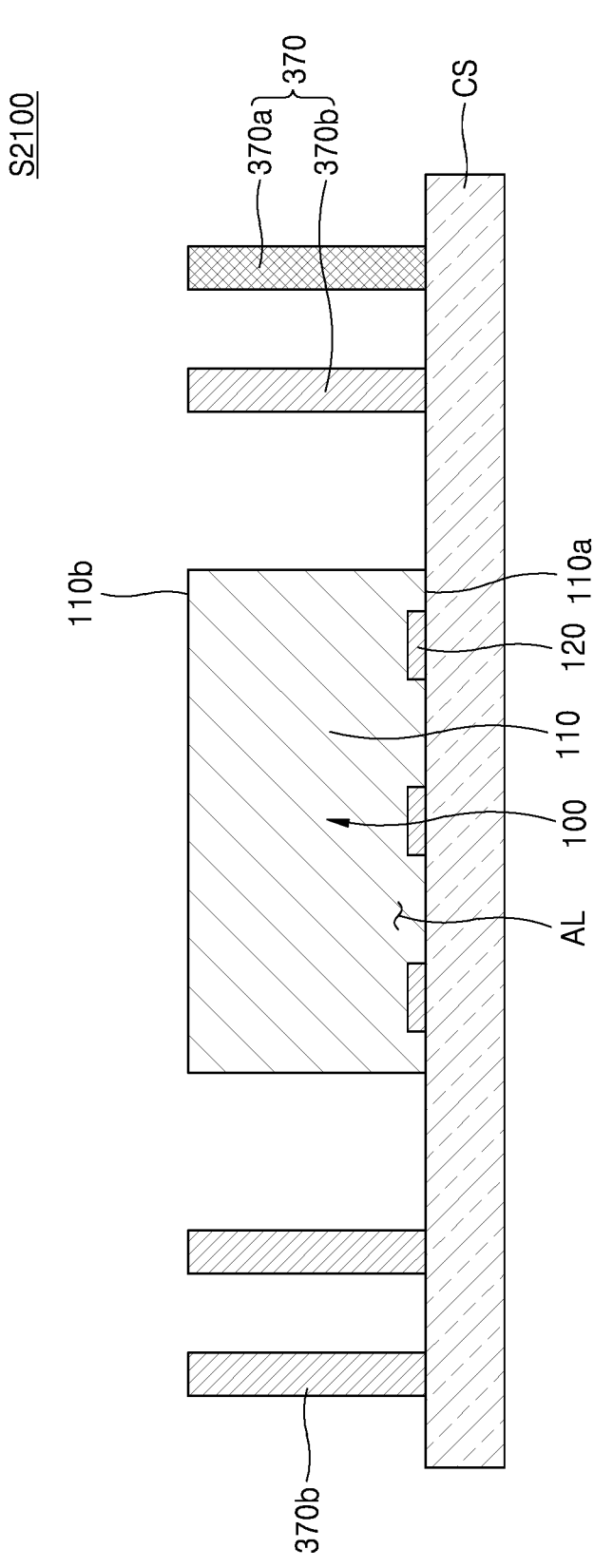
FIGS. 12A to 12D are diagrams illustrating respective operations of a method of manufacturing a semiconductor package, according to an example embodiment.
Figure 12B:
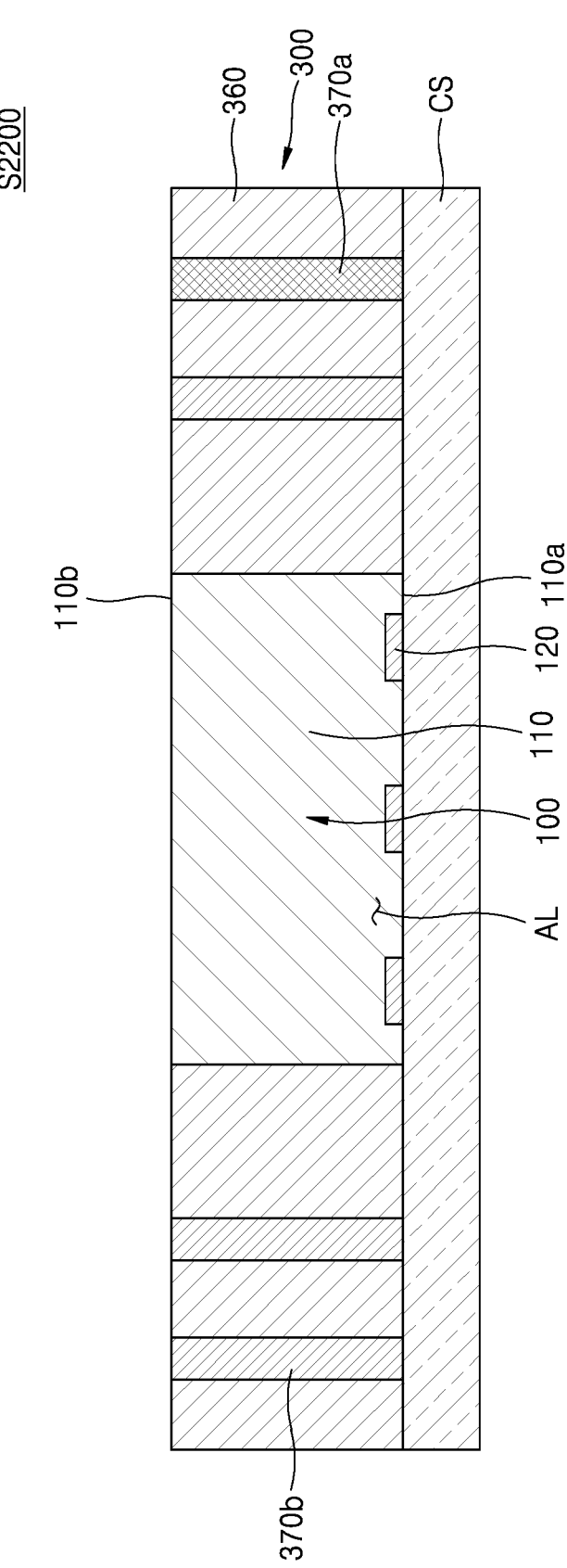
Figure 12C:
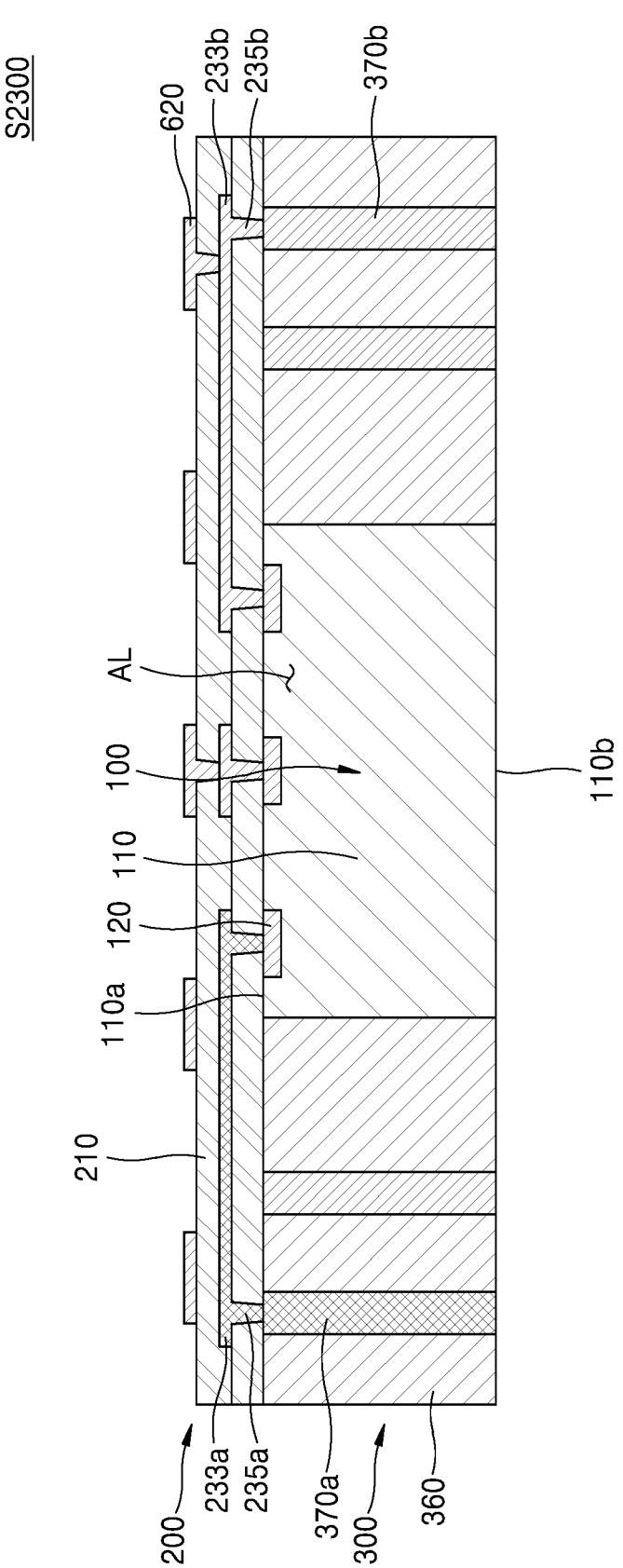
Figure 12D:
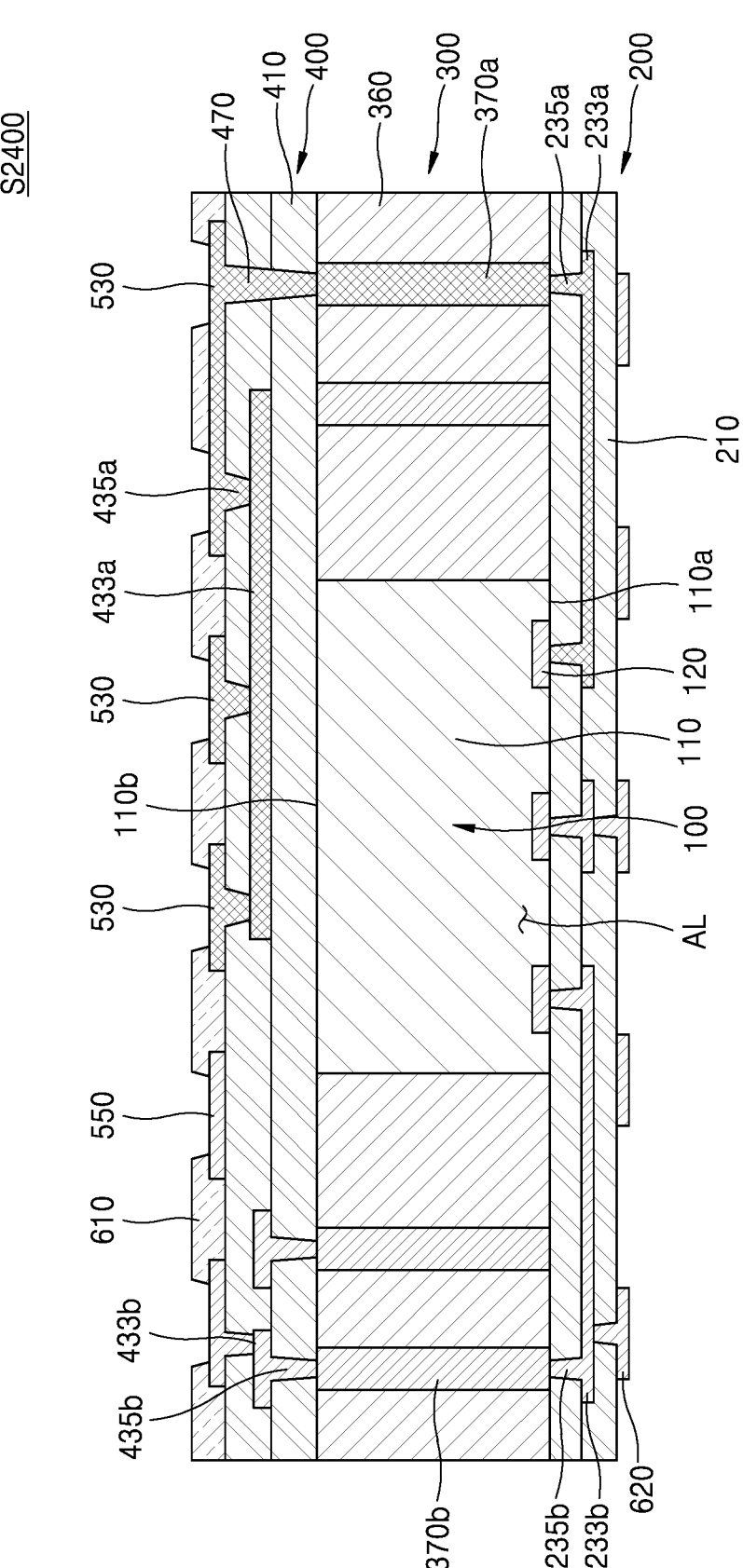

FIGS. 12A to 12D are diagrams illustrating respective operations of a method of manufacturing a semiconductor package according to an example embodiment. Specifically, FIG. 12A illustrates S2100 of arranging the semiconductor chip 100 and the first and second conductive posts 370a and 370b on a carrier substrate CS, FIG. 12B illustrates operation S2200 of forming the molding layer 360 surrounding the semiconductor chip 100 and the first and second conductive posts 370a and 370b, FIG. 12C illustrates operation S2300 of forming the lower redistribution structure 200, and FIG. 12D illustrates operation S2400 of forming the upper redistribution structure 400.

The method of manufacturing the semiconductor package according to an example embodiment may be the method of manufacturing the FOWLP described with reference to FIGS. 8 and 9.

The method of manufacturing the semiconductor package according to an example embodiment may include S2100 of arranging the semiconductor chip 100 and the first and second conductive posts 370a and 370b on a carrier substrate CS, operation S2200 of forming the molding layer 360 surrounding the semiconductor chip 100 and the first and second conductive posts 370a and 370b, operation S2300 of forming the lower redistribution structure 200, and operation S2400 of forming the upper redistribution structure 400.

Referring to FIG. 12A, in operation S2100, the semiconductor chip 100 and the first and second conductive posts 370a and 370b may be disposed on the carrier substrate CS. In an example embodiment, the first and second conductive posts 370a and 370b may be formed on the carrier substrate CS so that the first and second conductive posts 370a and 370b surround a side surface of the semiconductor chip 100.

In an example embodiment, the carrier substrate CS may be a substrate including any material having stability in a semiconductor process such as a photolithography process, a baking process, and an etching process.

Referring to FIG. 12B, in operation S2200, the molding layer 360 may be disposed on the carrier substrate CS. Also, the molding layer 360 may surround the semiconductor chip 100 and the first and second conductive posts 370a and 370b on the carrier substrate CS. For example, the molding layer 360 may contact side surfaces of the semiconductor chip 100 and the first and second conductive posts 370a and 370b.

In an example embodiment, operation S2200 may include forming the molding layer 360 on the carrier substrate CS so as to cover the semiconductor chip 100 and upper surfaces of the first and second conductive posts 370a and 370b and grinding a part of the molding layer 360 so that the second surface 110b of the semiconductor chip 100 and the upper surfaces of the first and second conductive posts 370a and 370b are exposed. In addition, after operation S2200 is performed, the carrier substrate CS may be removed.

Referring to FIG. 12C, in operation S2300, the lower redistribution structure 200 may be formed. Specifically, operation S2300 may include forming the lower redistribution insulating layer 210 on the first surface 110a of the semiconductor chip 100, forming the first and second inside lower redistribution line patterns 233a and 233b inside the lower redistribution insulating layer 210, and forming the first and second lower redistribution via patterns 235a and 235b inside the lower redistribution insulating layer 210.

In an example embodiment, the first and second lower redistribution line patterns 233a and 233b, and the first and second lower redistribution via patterns 235a and 235b may be formed through a general photolithography process, a plating process, an etching process, etc.

After operation S2300 is performed, an operation of forming the external connection pad 620 on the lower redistribution structure 200 may be additionally performed. The external connection pad 620 may be electrically connected to the chip pad 120 of the semiconductor chip 100 through the first and second lower redistribution line patterns 233a and 233b, and the first and second lower redistribution via patterns 235a and 235b.

Referring to FIG. 12D, in operation S2400, the upper redistribution structure 400 may be formed. Specifically, operation S2400 may include forming the upper redistribution insulating layer 410 on the second surface 110b of the semiconductor chip 100, and forming the first and second upper redistribution line patterns 433a and 433b, the first and second upper redistribution via patterns 435a and 435b, and the pad via patterns 470 inside the upper redistribution insulating layer 410.

In an example embodiment, the first and second upper redistribution line patterns 433a and 433b, the first and second upper redistribution via patterns 435a and 435b, and the pad via pattern 470 may be formed through the general photolithography process, the plating process, the etching process, etc.

After operation S2400 is performed, an operation of forming the first and second conductive pads 530 and 550 on the upper redistribution structure 400 may be performed. Also, an operation of forming the passivation layer 610 exposing at least a part of the first and second conductive pads 530 and 550 on the upper redistribution structure 400 may be additionally performed.

In an example embodiment, the plurality of first conductive pads 530 may be pads provided for movement of a data signal. In addition, the plurality of first conductive pads 530 may be connected to the chip pad 120 of the semiconductor chip 100 through the first upper redistribution line pattern 433a, the first upper redistribution via pattern 435a, the pad via pattern 470, the first conductive post 370a, the first lower redistribution line pattern 233a and the first lower redistribution via pattern 235a.

In an example embodiment, the first upper redistribution line pattern 433a may be disposed inside the upper redistribution insulating layer 410, and thus, a relatively greater thickness of the first upper redistribution line pattern 433a may be secured.

Accordingly, implementation of impedance values required by data signals moving through the plurality of first conductive pads 530 may be facilitated through the arrangement and thickness design of the first upper redistribution line pattern 433a. In addition, the plurality of first conductive pads 530 may be electrically connected through the first upper redistribution line pattern 433a, and thus the impedance values of the data signals moving through the plurality of first conductive pads 530 may be maintained uniformly.

In addition, the relatively greater thickness of the first upper redistribution line pattern 433a may be secured, and thus structural reliability of the semiconductor package manufactured by the method of manufacturing the semiconductor package of the inventive concept may be improved.

While the inventive concept has been particularly shown and described with reference to embodiments thereof, it will be understood that various changes in form and details may be made therein without departing from the spirit and scope of the following claims.

What is claimed is:

1. A semiconductor package comprising:

a semiconductor chip having a first surface and a second surface opposite to the first surface;

a lower redistribution structure disposed on the first surface of the semiconductor chip;

conductive connection members disposed on the lower redistribution structure so as to be outside the semiconductor chip;

an upper redistribution structure disposed on the second surface of the semiconductor chip;

a plurality of first conductive pads disposed on the upper redistribution structure to be spaced apart from each other; and a plurality of second conductive pads disposed on the upper redistribution structure to be connected with each other, wherein the upper redistribution structure comprises:

an upper redistribution insulating layer disposed on the second surface of the semiconductor chip;

a first upper redistribution line extending in a horizontal direction inside the upper redistribution insulating layer;

a plurality of first upper redistribution vias extending in a vertical direction inside the upper redistribution insulating layer, each of the plurality of first upper redistribution vias contacting an upper surface of the first upper redistribution line and connecting a corresponding one of the plurality of first conductive pads to the first upper redistribution line;

a pad line extending on the upper redistribution insulating layer, and directly connecting a first one of the plurality of second conductive pads with a second one of the plurality of second conductive pads; and a pad via extending in the vertical direction inside the upper redistribution insulating layer from a first one of the plurality of first conductive pads to a first one of the conductive connection members, and connecting the first one of the plurality of first conductive pads to the first one of the conductive connection members, wherein each of the plurality of first conductive pads, the plurality of second conductive pads, and the pad line are positioned at the same vertical level, and wherein the semiconductor package further comprises a passivation layer disposed on an upper portion of the upper redistribution insulating layer and exposing at least a part of each of the plurality of first conductive pads and at least a part of each of the plurality of second conductive pads.

2. The semiconductor package of claim 1, further comprising:

a second upper redistribution line extending inside the upper redistribution insulating layer; and a plurality of second upper redistribution vias extending in the vertical direction inside the upper redistribution insulating layer and connecting the second upper redistribution line to the plurality of second conductive pads, or connecting the second upper redistribution line to a second one of the conductive connection members.

3. The semiconductor package of claim 2, wherein the plurality of first conductive pads, the plurality of first upper redistribution vias, the first upper redistribution line, and the pad via are configured to provide a movement path of a data signal of the semiconductor chip, and wherein the plurality of second conductive pads, the pad line, the plurality of second upper redistribution vias, and the second upper redistribution line are configured to provide a movement path of a power signal for an operation of the semiconductor chip, or are configured to provide a movement path of a ground signal for grounding the semiconductor chip.

4. The semiconductor package of claim 2, wherein the plurality of first conductive pads, the plurality of first upper redistribution vias, the first upper redistribution line, and the pad via are configured to provide a movement path of a data signal of the semiconductor chip, and wherein the plurality of second conductive pads, the pad line, the plurality of second upper redistribution vias, and the second upper redistribution line are configured to provide a movement path of at least one of a command signal and an address signal of the semiconductor chip.

5. The semiconductor package of claim 1, wherein a lowermost surface of the pad via is at a lower level than a lower surface of the first upper redistribution line.

6. The semiconductor package of claim 1, wherein a thickness of the first upper redistribution line is greater than a thickness of each of the plurality of first conductive pads.

7. The semiconductor package of claim 6, wherein the thickness of each of the plurality of first conductive pads is in a range of 5 micrometers to 15 micrometers.

8. The semiconductor package of claim 7, wherein the thickness of the first upper redistribution line is greater than the thickness of each of the plurality of first conductive pads within a range of 7 micrometers to 40 micrometers.

9. The semiconductor package of claim 1, wherein the pad via is disposed to be spaced apart from the first upper redistribution line.

10. The semiconductor package of claim 1, further comprising:

a lower redistribution insulating layer on the first surface of the semiconductor chip;

a first lower redistribution line extending inside the lower redistribution insulating layer and connected to the first one of the conductive connection members; and a second lower redistribution line extending inside the lower redistribution insulating layer and connected to the second one of the conductive connection members, wherein the first lower redistribution line extends from below the first one of the conductive connection members to below the semiconductor chip, and wherein the second lower redistribution line extends from below the second one of the conductive connection members to below the semiconductor chip.

11. The semiconductor package of claim 1, further comprising:

a plurality of external connection terminals disposed in a lower portion of the lower redistribution structure, wherein at least one of the plurality of external connection terminals does not vertically overlap the semiconductor chip and is electrically connected to the second one of the conductive connection members.

12. The semiconductor package of claim 1, further comprising:

a plurality of base layers stacked on the lower redistribution structure in the vertical direction to surround the semiconductor chip; and a cover insulating layer disposed in a space between the semiconductor chip and the plurality of base layers, wherein the conductive connection members comprise:

a plurality of substrate lines disposed on at least one of upper and lower surfaces of the plurality of base layers; and a plurality of second substrate vias passing through the plurality of base layers in the vertical direction and connecting the plurality of substrate lines.

13. The semiconductor package of claim 1, further comprising:

a molding layer surrounding the semiconductor chip on the lower redistribution structure, wherein the conductive connection members comprise a conductive post passing through the molding layer in the vertical direction and connecting the lower redistribution structure to the upper redistribution structure.

14. A semiconductor package comprising:

a semiconductor chip having a first surface and a second surface opposite to the first surface;

a lower redistribution structure disposed on the first surface of the semiconductor chip;

a substrate layer disposed on the lower redistribution structure and surrounding the semiconductor chip, and comprising a plurality of base layers stacked in a vertical direction;

a plurality of substrate lines disposed on at least one of upper and lower surfaces of the plurality of base layers;

a plurality of substrate vias passing through the plurality of base layers in the vertical direction and connecting the plurality of substrate lines;

an upper redistribution structure disposed on the second surface of the semiconductor chip;

a plurality of first conductive pads disposed on the upper redistribution structure to be spaced apart from each other; and a plurality of second conductive pads on the upper redistribution structure to be connected with each other, wherein the upper redistribution structure comprises:

an upper redistribution insulating layer on the second surface of the semiconductor chip;

a first upper redistribution line extending in a horizontal direction inside the upper redistribution insulating layer, overlapping the plurality of first conductive pads in the vertical direction, and connecting the plurality of first conductive pads to each other; and a pad line extending on the upper redistribution insulating layer, and directly connecting a first one of the plurality of second conductive pads with a second one of the plurality of second conductive pads, wherein each of the plurality of first conductive pads, the plurality of second conductive pads, and the pad line are positioned at the same vertical level, and wherein the semiconductor package further comprises a passivation layer disposed on an upper portion of the upper redistribution insulating layer and exposing at least a part of each of the plurality of first conductive pads and at least a part of each of the plurality of second conductive pads.

15. The semiconductor package of claim 14, wherein a thickness of the first upper redistribution line is greater than a thickness of the pad line.

16. The semiconductor package of claim 14, wherein the upper redistribution structure comprises:

a plurality of first upper redistribution vias extending in the vertical direction inside the upper redistribution insulating layer and contacting an upper surface of the first upper redistribution line, each of the plurality of first upper redistribution vias connecting a corresponding one of the plurality of first conductive pads to the first upper redistribution line; and a pad via extending in the vertical direction inside the upper redistribution insulating layer, and connecting a first one of the plurality of first conductive pads to the substrate lines of the substrate layer, wherein an upper surface of the pad via contacts a lower surface of the first one of the plurality of first conductive pads, and wherein a lower surface of the pad via is at a lower level than a lower surface of the first upper redistribution line.

17. The semiconductor package of claim 16, wherein the first one of the plurality of first conductive pads vertically overlaps the first upper redistribution line and the pad via.

* * * * *